United States Patent
Lee et al.

(10) Patent No.: US 12,400,998 B2
(45) Date of Patent: Aug. 26, 2025

(54) SEMICONDUCTOR PACKAGE INCLUDING PLURALITY OF SEMICONDUCTOR CHIPS AND METHOD FOR MANUFACTURING THE SAME

(71) Applicant: Samsung Electronics Co., Ltd., Suwon-si (KR)

(72) Inventors: Kunsil Lee, Hwaseong-si (KR); Dongkwan Kim, Hwaseong-si (KR)

(73) Assignee: Samsung Electronics Co., Ltd., Gyeonggi-do (KR)

( * ) Notice: Subject to any disclaimer, the term of this patent is extended or adjusted under 35 U.S.C. 154(b) by 0 days.

(21) Appl. No.: 18/438,658

(22) Filed: Feb. 12, 2024

(65) Prior Publication Data

US 2024/0186294 A1 Jun. 6, 2024

Related U.S. Application Data

(63) Continuation of application No. 17/384,046, filed on Jul. 23, 2021, now Pat. No. 11,935,868.

(30) Foreign Application Priority Data

Jan. 11, 2021 (KR) ........................ 10-2021-0003240

(51) Int. Cl.
*H01L 25/065* (2023.01)
*H01L 23/00* (2006.01)
*H01L 23/31* (2006.01)

(52) U.S. Cl.
CPC ...... *H01L 25/0657* (2013.01); *H01L 23/3128* (2013.01); *H01L 24/32* (2013.01);
(Continued)

(58) Field of Classification Search
CPC ... H10B 80/00; H01L 25/0657; H01L 25/105; H01L 23/3128; H01L 24/32; H01L 24/73;
(Continued)

(56) References Cited

U.S. PATENT DOCUMENTS

| 8,664,780 B2 | 3/2014 | Han et al. |
| 8,945,985 B2 | 2/2015 | Kim et al. |

(Continued)

FOREIGN PATENT DOCUMENTS

| KR | 101799326 B1 | 11/2017 |
| KR | 10-2018-0022394 A | 3/2018 |
| KR | 10-2019-0136459 A | 12/2019 |

OTHER PUBLICATIONS

Non Final Office Action issued May 15, 2013 in U.S. Appl. No. 17/384,046.

(Continued)

*Primary Examiner* — Jasmine J Clark
(74) *Attorney, Agent, or Firm* — Harness, Dickey & Pierce, P.L.C.

(57) ABSTRACT

A semiconductor package is disclosed. The semiconductor package includes a base structure, a first semiconductor chip over the base structure, a second semiconductor chip over the first semiconductor chip, an adhesive layer between the first semiconductor chip and the second semiconductor chip, and a molding layer covering the first semiconductor chip, the second semiconductor chip and the adhesive layer, and including an interposition portion interposed between the base structure and the first semiconductor chip.

13 Claims, 22 Drawing Sheets

(52) U.S. Cl.
CPC .... *H01L 24/73* (2013.01); *H01L 2224/32145* (2013.01); *H01L 2224/73204* (2013.01); *H01L 2225/06513* (2013.01); *H01L 2225/06517* (2013.01)

(58) Field of Classification Search
CPC ........... H01L 24/13; H01L 2224/32145; H01L 2224/73204; H01L 2225/06513
USPC .................................................. 257/777, 668
See application file for complete search history.

(56) References Cited

U.S. PATENT DOCUMENTS

| | | |
|---|---|---|
| 9,165,916 B2 | 10/2015 | Chung et al. |
| 9,653,430 B2 | 5/2017 | Kim et al. |
| 9,991,234 B2 | 6/2018 | Seo et al. |
| 10,026,724 B2 | 7/2018 | Kim et al. |
| 10,665,571 B2 | 5/2020 | Lee |
| 2017/0365582 A1* | 12/2017 | Seo ........................ H01L 24/33 |
| 2018/0286835 A1 | 10/2018 | Nah |
| 2020/0135698 A1 | 4/2020 | Hong et al. |

OTHER PUBLICATIONS

Notice of Allowance issued Nov. 13, 2013 in U.S. Appl. No. 17/384,046.
Office Action issued Jan. 13, 2025 in Korean Application No. 10-2021-0003240.

* cited by examiner

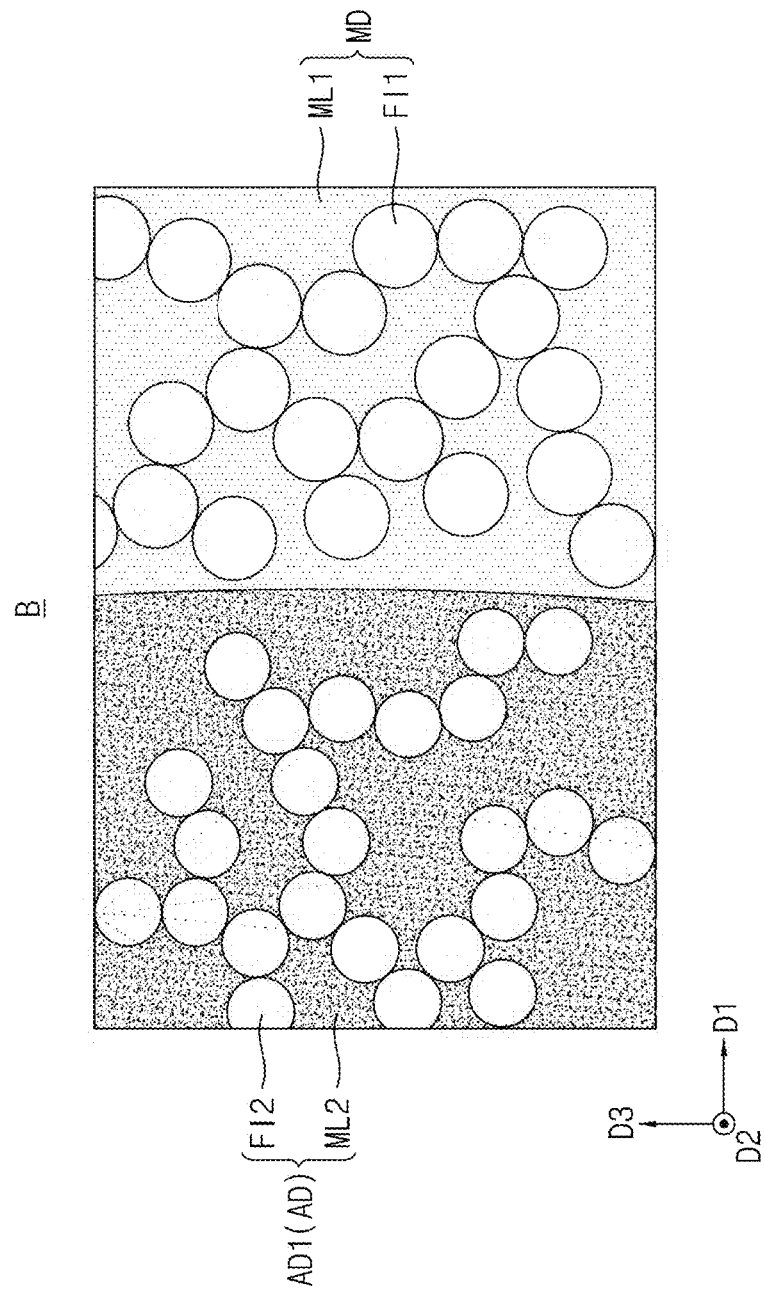

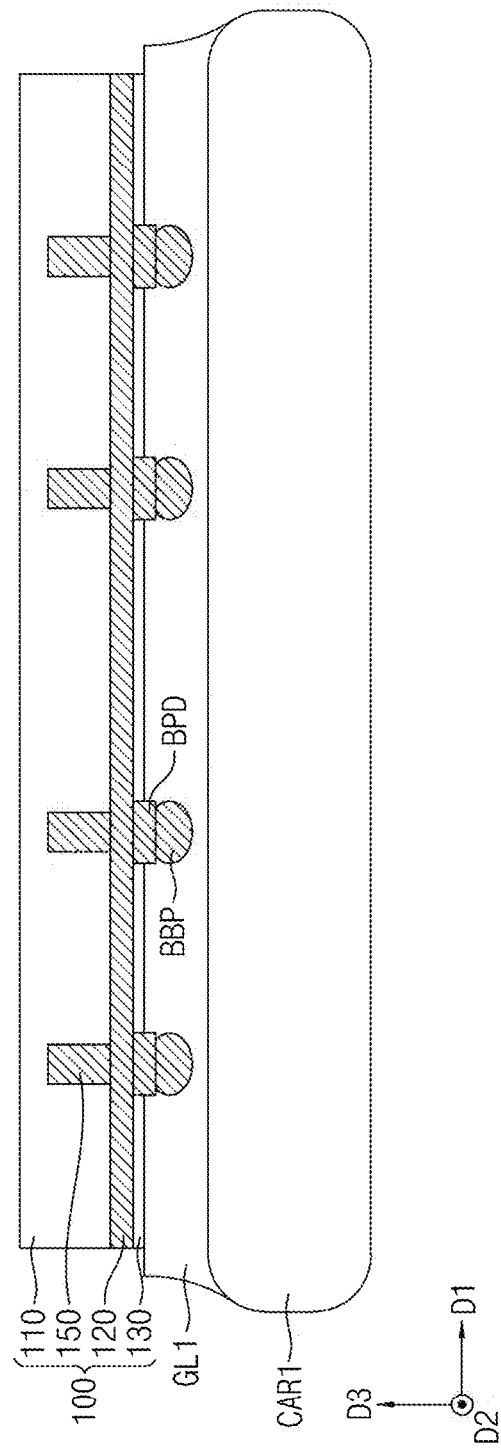

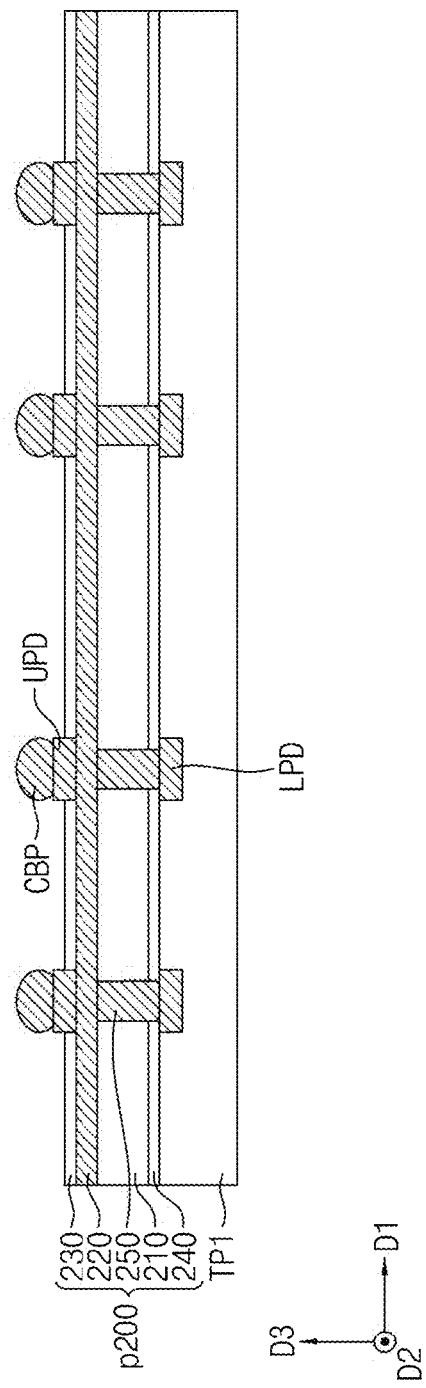

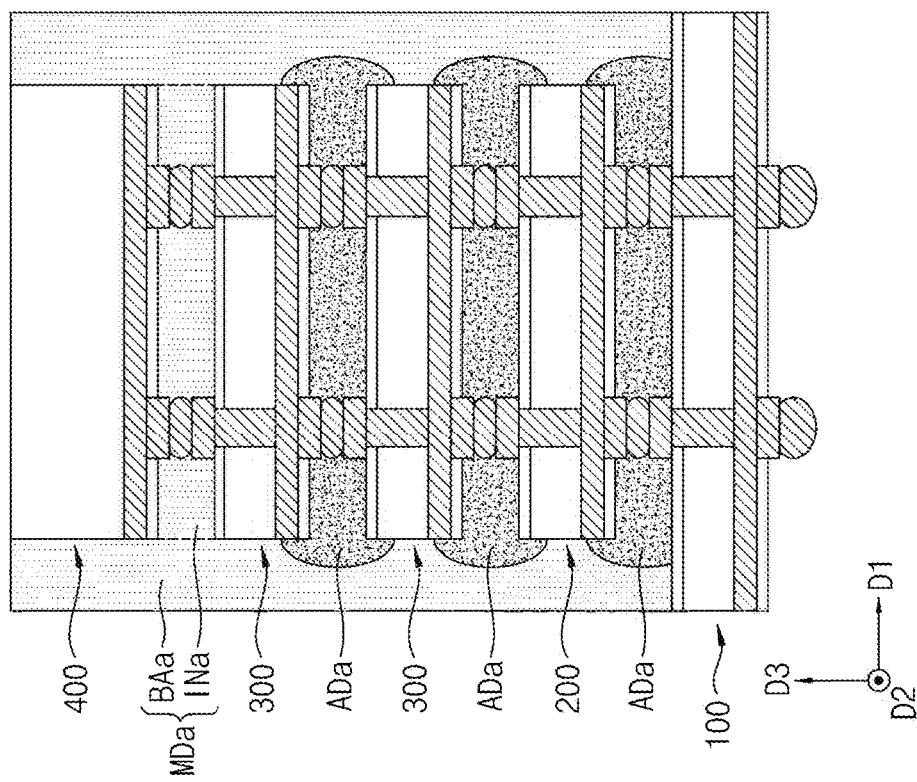

SEMICONDUCTOR PACKAGE INCLUDING PLURALITY OF SEMICONDUCTOR CHIPS AND METHOD FOR MANUFACTURING THE SAME

CROSS-REFERENCE TO THE RELATED APPLICATIONS

This application is a Continuation of U.S. application Ser. No. 17/384,046, filed on Jul. 23, 2021, now U.S. Pat. No. 11,935,868, which claims priority from Korean Patent Application No. 10-2021-0003240, filed on Jan. 11, 2021, in the Korean Intellectual Property Office, the disclosures of each of which are incorporated herein by reference in its entirety.

BACKGROUND

1. Field

The example embodiments of the disclosure relate to a semiconductor package and a method for manufacturing the same. More particularly, the example embodiments of the disclosure relate to a semiconductor package including a plurality of semiconductor chips and a method for manufacturing the same.

2. Description of the Related Art

In accordance with advances in electronics and demand of users, electronic appliances become further miniaturized and lightened. Semiconductor packages used in such electronic appliances are required to have high performance and a large capacity in addition to miniaturization and lightness. In order to achieve high performance and a large capacity as well as miniaturization and lightness, research and development of semiconductor chips including a through-silicon via (TSV) and a semiconductor package, in which the semiconductor chips are stacked, is being continuously conducted.

SUMMARY

The example embodiments of the disclosure provide a semiconductor package having enhanced reliability.

A semiconductor package according to some example embodiments of the disclosure may include a base structure, a first semiconductor chip over the base structure, a second semiconductor chip over the first semiconductor chip, an adhesive layer between the first semiconductor chip and the second semiconductor chip, and a molding layer covering the first semiconductor chip, the second semiconductor chip and the adhesive layer and including an interposition portion interposed between the base structure and the first semiconductor chip.

A semiconductor package according to some example embodiments of the disclosure may include a base structure, a first semiconductor chip over the base structure, a first connecting structure electrically interconnecting the base structure and the first semiconductor chip, a second semiconductor chip over the first semiconductor chip, a second connecting structure electrically interconnecting the first semiconductor chip and the second semiconductor chip, an adhesive layer between the first semiconductor chip and the second semiconductor chip, and a molding layer covering the first semiconductor chip, the second semiconductor chip, and the adhesive layer, and including an interposition portion contacting the first connecting structure.

A semiconductor package according to some example embodiments of the disclosure may include a base structure, a first semiconductor chip over the base structure, second semiconductor chips over the first semiconductor chip, connecting structures electrically interconnecting the base structure, the first semiconductor chip and the second semiconductor chips, adhesive layers overlapping with the base structure, the first semiconductor chip and the second semiconductor chips, and a molding layer covering the first semiconductor chip, the second semiconductor chips and the adhesive layers. The molding layer may include an interposition portion overlapping with the base structure, the first semiconductor chip, the second semiconductor chips, and the adhesive layers. The interposition portion may contact at least one of the connecting structures and a bottom surface of at least one of the first and second semiconductor chips.

A method for manufacturing a semiconductor package in accordance with some example embodiments of the disclosure may include forming a base structure, providing a first semiconductor chip over the base structure, a cavity being defined between the base structure and the first semiconductor chip, providing a second semiconductor chip over the first semiconductor chip using an adhesive layer, and forming a molding layer covering the first semiconductor chip, the second semiconductor chip and the adhesive layer. The forming the molding layer may include filling the cavity with an interposition portion of the molding layer.

BRIEF DESCRIPTION OF THE DRAWINGS

FIG. 1C is an enlarged view of a portion B in FIG. 1B.
FIGS. 2a, 2b, 2c, 2d, 2e, 2f, 2g, 2h, 2i, 2j, 2k, and 2l are sectional views explaining a method for manufacturing a semiconductor package in accordance with some example embodiments of the disclosure.
FIG. 3 is a sectional view of a semiconductor package according to some example embodiments of the disclosure.

DETAILED DESCRIPTION OF EXAMPLE EMBODIMENTS

One or more example embodiments will be described in detail with reference to the accompanying drawings. Example embodiments, however, may be embodied in various different forms, and should not be construed as being limited to only the illustrated embodiments. Unless otherwise noted, like reference, characters denote like elements throughout the attached drawings and written description, and thus descriptions will not be repeated.

Although the terms "first," "second," "third," etc., may be used herein to describe various elements, components, regions, layers, and/or sections, these elements, components, regions, layers, and/or sections, should not be limited by these terms. These terms are only used to distinguish one element, component, region, layer, or section, from another region, layer, or section. Thus, a first element, component, region, layer, or section, discussed below may be termed a second element, component, region, layer, or section, without departing from the scope of this disclosure.

Spatially relative terms, such as "below," "above," and the like, may be used herein for ease of description to describe one element or feature's relationship to another element(s) or feature(s) as illustrated in the figures. It will be understood that the spatially relative terms are intended to encompass different orientations of the device in use or operation in addition to the orientation depicted in the figures. For example, the device may be otherwise oriented (rotated 90 degrees or at other orientations) and the spatially relative descriptors used herein interpreted accordingly.

When the terms "about" or "substantially" are used in this specification in connection with a numerical value, it is intended that the associated numerical value includes a manufacturing tolerance (e.g., ±10%) around the stated numerical value. Moreover, when the words "similar" and "substantially" are used in connection with composition and/or geometric shapes, it is intended that precision of composition and/or the geometric shape is not required but that latitude for the composition and/or shape is within the scope of the disclosure. It will be understood that these values, compositions, and shapes should be construed as including a manufacturing or operational tolerance (e.g., ±10%) around the stated numerical values, compositions, or shapes.

Figure 1A:
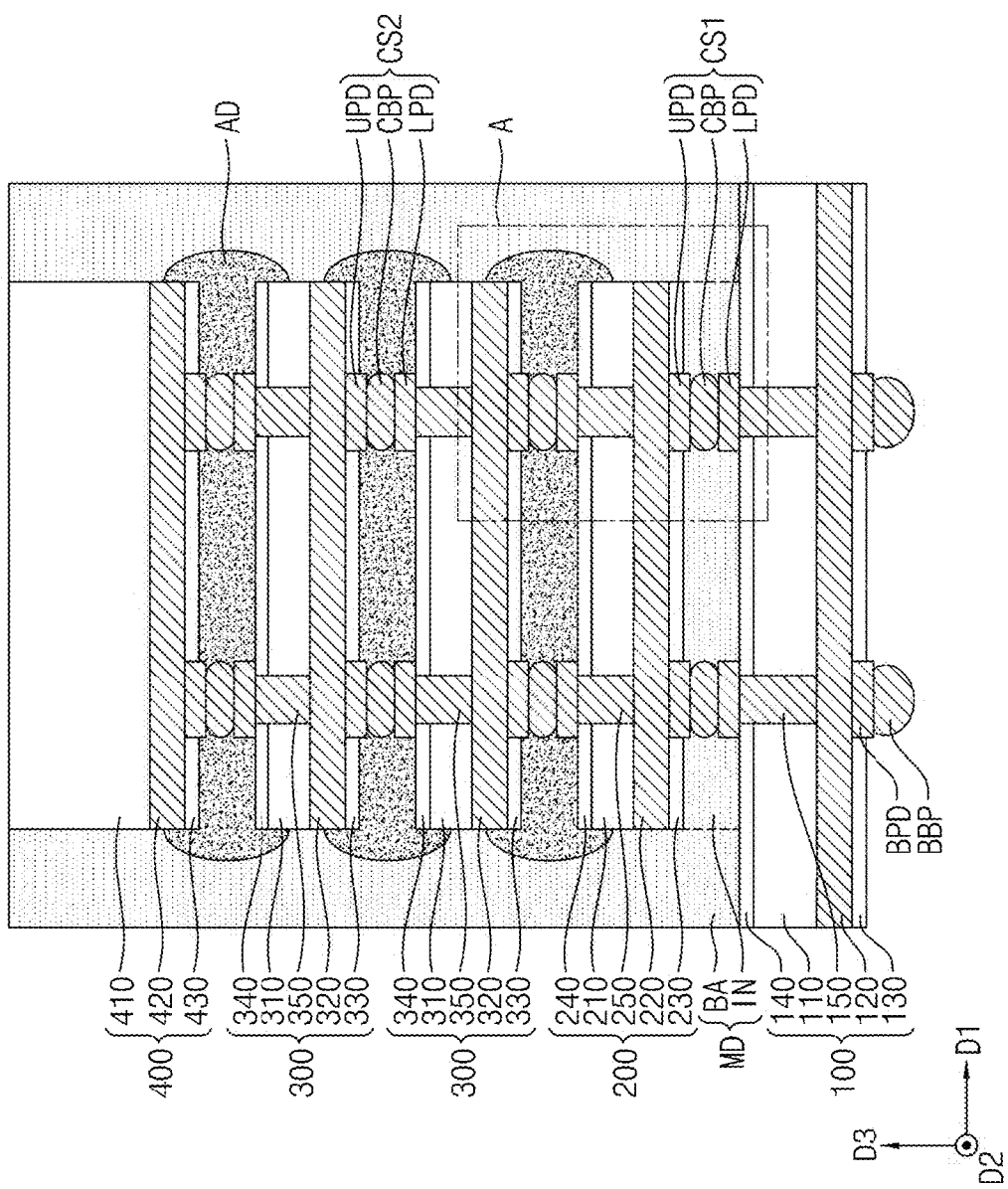
FIG. 1A is a sectional view of a semiconductor package according to some example embodiments of the disclosure.
Figure 1B:
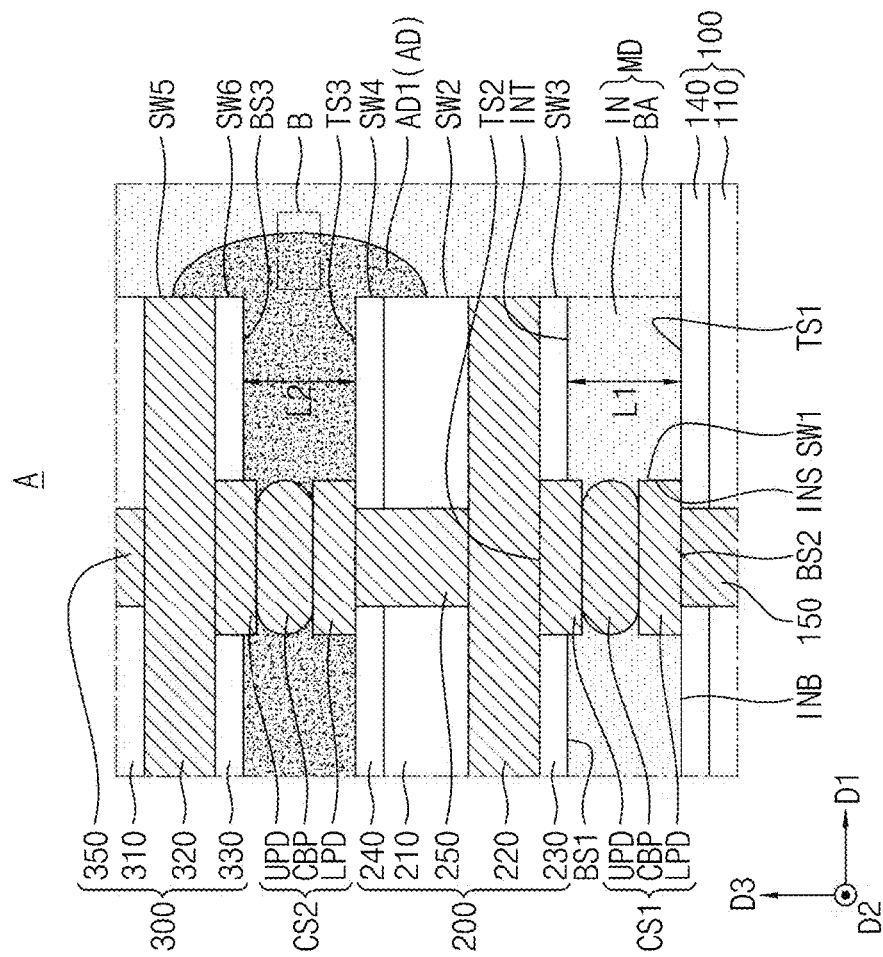
FIG. 1B is an enlarged view of a portion A in FIG. 1A.

FIG. 1A is a sectional view of a semiconductor package according to some example embodiments of the disclosure. FIG. 1B is an enlarged view of a portion A in FIG. 1A. FIG. 1C is an enlarged view of a portion B in FIG. 1B.

Referring to FIG. 1A, a semiconductor package 1 may include a base structure 100. The base structure 100 may include a first substrate 110, a first wiring structure 120, a first lower protective layer 130, a first upper protective layer 140, and first through vias 150.

The first substrate 110 may have the form of a plate extending along a plane defined by a first direction D1 and a second direction D2. The first direction D1 and the second direction D2 may intersect each other. For example, the first direction D1 and the second direction D2 may perpendicularly intersect each other. In some embodiments, the first substrate 110 may be a semiconductor substrate. For example, the first substrate 110 may include at least one of an elemental semiconductor (e.g., silicon, germanium) and/or a compound semiconductor (e.g., silicon-germanium, and/or a III-V semiconductor (e.g., GaP, and/or GaAs)). In some embodiments, the first substrate 110 may be a silicon-on-insulator (SOI) substrate and/or a germanium-on-insulator (GOI) substrate.

The first substrate 110 may be provided on the first wiring layer 120. The first wiring layer 120 may be provided under the first substrate 110. The first wiring layer 120 may include wirings, and an insulating layer surrounding the wirings. The wirings of the first wiring layer 120 may include a conductive material.

In some embodiments, the base structure 100 may include a logic circuit, and/or the base structure 100 may include a memory device.

The first wiring layer 120 may be provided on the first lower protective layer 130. The first lower protective layer 130 may be provided under the first wiring layer 120. The first lower protective layer 130 may function to protect the first wiring layer 120. The first lower protective layer 130 may cover a bottom surface of the first wiring layer 120. The first lower protective layer 130 may include an insulating material. In some embodiments, the first lower protective layer 130 and the insulating layer of the first wiring layer 120 may include the same and/or a different insulating material. In some embodiments, the first lower protective layer 130 may include silicon nitride and/or silicon oxide.

The first upper protective layer 140 may be provided on the first substrate 110. The first upper protective layer 140 may function to protect the first substrate 110. The first upper protective layer 140 may cover a top surface of the first substrate 110. The first upper protective layer 140 may include an insulating material. In some embodiments, the first lower protective layer 130 and the first upper protection layer 140 may include the same and/or a different insulating material. For example, the first upper protective layer 140 may include silicon nitride and/or silicon oxide.

The first through vias 150 may extend through the first substrate 110 and the first upper protective layer 140. The first through vias 150 may be electrically connected to the wirings of the first wiring layer 120. The first through vias 150 may include a conductive material.

Although the base structure 100 is shown and described as including the first substrate 110, the first wiring layer 120, and the first through vias 150, the example embodiments of the disclosure are not limited thereto. In some embodiments, the base structure 100 may be and/or include an interposer. The interposer may be configured, for example, to expand the pitch between contacts associated with a first through via 150 on a surface (e.g., a lower surface) of the interposer compared to the equivalent contacts on another surface (e.g., an upper surface).

Base pads BPD and base bumps BBP may be provided under the base structure 100. The base pads BPD may extend through the first lower protective layer 130. The base pads BPD may be electrically connected to the wirings of the first wiring layer 120. The base pads BPD may include a conductive material. Though illustrated as extending past the first lower protective layer 130, the example embodiments of the disclosure are not limited thereto, and a bottom surface of the base pads BPD may be level or at a different level with a bottom surface of the first lower protective layer 130. The base bumps BBP may be connected to the base pads BPD. The base bumps BBP may include a conductive material. For example, the base bumps BBP may include a solder ball and/or pillar, and may include a solder, though the example embodiments of the disclosure are not limited thereto.

A first semiconductor chip 200 may be provided over the base structure 100. For example, the first semiconductor chip 200 may be provided over the base structure 100 in a vertical direction. The first semiconductor chip 200 may be spaced apart from the base structure 100 in a third direction D3. The first semiconductor chip 200 may be a semiconductor chip adjacent to the base structure 100. The third direction D3 may intersect with the first direction D1 and the second direction D2. The third direction D3 may perpendicularly intersect with the first direction D1 and the second direction D2 (e.g., the third direction D3 may be perpendicular to the plane defined by the first direction D1 and the second direction D2 and/or the vertical direction).

The first semiconductor chip 200 may include a second substrate 210, a second wiring layer 220, a second lower protective layer 230, a second upper protective layer 240, and second through vias 250.

The second substrate 210 may have the form of a plate extending along a plane defined by the first direction D1 and the second direction D2. In some embodiments, the second substrate 210 may be a semiconductor substrate. For example, the second substrate 210 may include at least one of an elemental semiconductor (e.g., silicon, germanium) and/or a compound semiconductor (e.g., silicon-germanium, and/or a III-V semiconductor (e.g., GaP, and/or GaAs)). In some embodiments, the second substrate 210 may be a silicon-on-insulator (SOI) substrate and/or a germanium-on-insulator (GOI) substrate.

The second substrate 210 may be provided on the second wiring layer 220. The second wiring layer 220 may be provided under the second substrate 210. The second wiring layer 220 may include wirings, and an insulating layer surrounding the wirings. The wirings of the second wiring layer 220 may include a conductive material. In some embodiments, the first wiring layer 120 and the second wiring layer 220 may include the same and/or different materials.

In some embodiments, the first semiconductor chip 200 may include a memory device. For example, the memory device may be volatile memory such as dynamic random access memory (DRAM) and/or non-volatile memory such as flash memory, magnetic RAM (MRAM), ferroelectric RAM (FRAM), phase change RAM (PRAM), resistive RAM (RRAM), etc. In some embodiments, the first semiconductor chip 200 may include a logic circuit.

The second wiring layer 220 may be provided on the second lower protective layer 230. The second lower protective layer 230 may be provided under the second wiring layer 220. The second lower protective layer 230 may function to protect the second wiring layer 220. The second lower protective layer 230 may face the base structure 100. The second lower protective layer 230 may face the first upper protective layer 140 of the base structure 100. The second lower protective layer 230 may cover a bottom surface of the second wiring layer 220. The second lower protective layer 230 may include an insulating material. The first lower protective layer 130 and the second lower protective layer 230 may include the same and/or a different insulating material. For example, the second lower protective layer 230 may include silicon nitride and/or silicon oxide.

The second upper protective layer 240 may be provided on the second substrate 210. The second upper protective layer 240 may function to protect the second substrate 210. The second upper protective layer 240 may cover a top surface of the second substrate 210. The second upper protective layer 240 may include an insulating material. The first upper protective layer 140 and the second upper protection layer 240 may include the same and/or a different insulating material. For example, the second upper protective layer 240 may include silicon nitride and/or silicon oxide.

The second through vias 250 may extend through the second substrate 210 and the second upper protective layer 240. The second through vias 250 may be electrically connected to the wirings of the second wiring layer 220. The second through vias 250 may include a conductive material.

First connecting structures CS1 may be provided between the base structure 100 and the first semiconductor chip 200. The first connecting structures CS1 may electrically interconnect the base structure 100 and the first semiconductor chip 200. The first connecting structures CS1 may include a conductive material. Each of the first connecting structures CS1 may include an upper pad UPD, a lower pad LPD, and a connecting bump CBP.

The upper pads UPD of the first connecting structures CS1 may be provided on and/or extend through the second lower protective layer 230 of the first semiconductor chip 200. The upper pads UPD of the first connecting structures CS1 may be electrically connected to the wirings of the second wiring layer 220 of the first semiconductor chip 200. The upper pads UPD of the first connecting structures CS1 may include a conductive material.

The lower pads LPD of the first connecting structures CS1 may be provided on and/or extend through the first upper protective layer 140 of the base structure 100. The lower pads LPD of the first connecting structures CS1 may be electrically connected to the first through vias 150 of the base structure 100. The lower pads LPD of the first connecting structures CS1 may include a conductive material.

The connecting bump CBP of each first connecting structure CS1 may be provided between the upper pad UPD and the lower pad LPD in the first connecting structure CS1. The connecting bump CBP of the first connecting structure CS1 may electrically interconnect the upper pad UPD and the lower pad LPD in the first connecting structure CS1. The connecting bump CBP of the first connecting structure CS1 may include a conductive material. For example, the connecting bumps CBP may include a solder ball and/or pillar, and may include a solder, though the example embodiments of the disclosure are not limited thereto.

A plurality of second semiconductor chips 300 may be provided over the first semiconductor chip 200. For example, the plurality of second semiconductor chips 300 may be provided over the first semiconductor chip 200 in a vertical direction. For example, the plurality of second semiconductor chips 300 may be stacked over the first semiconductor chip 200 in the third direction D3. The first semiconductor chip 200 and the second semiconductor chip 300 adjacent (nearest) to the first semiconductor chip 200 may be spaced apart from each other in the third direction D3. The second semiconductor chips 300 may be spaced apart from one another in the third direction D3. Although the number of the second semiconductor chips 300 stacked over the first semiconductor chip 200 is shown as being two in FIG. 1, the number of the second semiconductor chips 300 is not limited thereto.

Each of the second semiconductor chips 300 may include a third substrate 310, a third wiring layer 320, a third lower protective layer 330, a third upper protective layer 340, and third through vias 350.

The third substrate 310 may have the form of a plate extending along a plane defined by the first direction D1 and the second direction D2. In some embodiments, the third substrate 310 may be a semiconductor substrate. For example, the third substrate 310 may include at least one of an elemental semiconductor (e.g., silicon, germanium) and/or a compound semiconductor (e.g., silicon-germanium, and/or a III-V semiconductor (e.g., GaP, and/or GaAs)). In some embodiments, the third substrate 310 may be a silicon-on-insulator (SOI) substrate or a germanium-on-insulator (GOI) substrate.

The third substrate 310 may be provided on the third wiring layer 320. The third wiring layer 320 may be provided under the third substrate 310. The third wiring layer 320 may include wirings, and an insulating layer surrounding the wirings. The wirings of the third wiring layer 320 may include a conductive material. In some embodiments, the first wiring layer 120 and the second wiring layer 220 may include the same and/or different materials.

In some embodiments, the second semiconductor chip 300 may include a memory device. In some embodiments, the second semiconductor chip 300 may include a logic circuit.

The third wiring layer 320 may be provided on the third lower protective layer 330. The third lower protective layer 330 may be provided under the third wiring layer 320. The third lower protective layer 330 may function to protect the third wiring layer 320. The third lower protective layer 330 may cover a bottom surface of the third wiring layer 320. The third lower protective layer 330 may include an insulating material. The first lower protective layer 130 and the third lower protective layer 330 may include the same and/or a different insulating material. For example, the third lower protective layer 330 may include silicon nitride and/or silicon oxide.

The third upper protective layer 340 may be provided on the third substrate 310. The third upper protective layer 340 may function to protect the third substrate 310. The third upper protective layer 340 may cover a top surface of the third substrate 310. The third upper protective layer 340 may include an insulating material. In some embodiments, the first upper protective layer 140 and the third upper protective layer 340 may include the same and/or a different insulating material. For example, the third upper protective layer 340 may include silicon nitride and/or silicon oxide.

The third through vias 350 may extend through the third substrate 310 and the third upper protective layer 340. The third through vias 350 may be electrically connected to the wirings of the third wiring layer 320. The third through vias 350 may include a conductive material.

A third semiconductor chip 400 may be provided over the plurality of second semiconductor chips 300. For example, the third semiconductor chip 400 may be provided over the second semiconductor chips 300 in a vertical direction. The third semiconductor chip 400 may be spaced apart from the second semiconductor chip 300 adjacent to the third semiconductor chip 400 in the third direction D3. The first to third semiconductor chips 200, 300 and 400 may be sequentially stacked over the base structure 100 in the third direction D3. The base structure 100 and the first to third semiconductor chips 200, 300, and 400 may overlap in the third direction D3.

The third semiconductor chip 400 may include a second base structure 410, a fourth wiring layer 420, and a fourth lower protective layer 430.

The second base structure 410 may have the form of a plate extending along a plane defined by the first direction D1 and the second direction D2. In some embodiments, the second base structure 410 may be a semiconductor substrate. For example, the second base structure 410 may include at least one of an elemental semiconductor (e.g., silicon, germanium) and/or a compound semiconductor (e.g., silicon-germanium, and/or a III-V semiconductor (e.g., GaP, and/or GaAs)). In some embodiments, the second base structure 410 may be a silicon-on-insulator (SOI) substrate or a germanium-on-insulator (GOI) substrate.

The second base structure 410 may be provided on the fourth wiring layer 420. The fourth wiring layer 420 may be provided under the second base structure 410. The fourth wiring layer 420 may include wirings, and an insulating layer surrounding the wirings. The wirings of the fourth wiring layer 420 may include a conductive material. In some embodiments, the first wiring layer 120 and the fourth wiring layer 420 may include the same and/or different materials.

In some embodiments, the third semiconductor chip 400 may include a memory device. In some embodiments, the third semiconductor chip 400 may include a logic circuit.

The fourth wiring layer 420 may be provided on the fourth lower protective layer 430. The fourth lower protective layer 430 may be provided under the fourth wiring layer 420. The fourth lower protective layer 430 may function to protect the fourth wiring layer 420. The fourth lower protective layer 430 may cover a bottom surface of the fourth wiring layer 420. The fourth lower protective layer 430 may include an insulating material. The first lower protective layer 130 and the fourth lower protective layer 430 may include the same and/or a different insulating material. For example, the fourth lower protective layer 430 may include silicon nitride and/or silicon oxide.

Second connecting structures CS2 may be provided between a second semiconductor chip 200 and a neighboring semiconductor chip (e.g., between the first semiconductor chip 200 and the second semiconductor chip 300 adjacent to the first semiconductor chip 200, between adjacent ones of the semiconductor chips 200, and/or between the third semiconductor chip 400 and the second semiconductor chip 300 adjacent to the third semiconductor chip 400, respectively).

Each of the second connecting structures CS2 may electrically interconnect the first semiconductor chip 200 and the second semiconductor chip 300 adjacent to the first semiconductor chip 200, may electrically interconnect the adjacent semiconductor chips 200, and/or may electrically interconnect the third semiconductor chip 400 and the second semiconductor chip 300 adjacent to the third semiconductor chip 400. The second connecting structures CS2 may include a conductive material. Each of the second connecting structures CS2 may include an upper pad UPD, a lower pad LPD, and/or a connecting bump CBP.

The upper pads UPD of the second connecting structures CS2 may be provided on and/or extend through the third lower protective layers 330 of corresponding ones of the second semiconductor chips 300 or may extend through the fourth lower protective layer 430 of the third semiconductor chip 400. The upper pads UPD of the second connecting structures CS2 may be electrically connected to the wirings of the third wiring layers 320 of the corresponding second semiconductor chips 300 and/or may be electrically connected to the wirings of the fourth wiring layer 420 of the third semiconductor chip 400. The upper pads UPD of the second connecting structures CS2 may include a conductive material.

The lower pads LPD of the second connecting structures CS2 may be provided on and/or extend through the second upper protective layer 240 of the first semiconductor chip 200 or may be provided on the third upper protective layers 340 of the corresponding second semiconductor chips 300. The lower pads LPD of the second connecting structures CS2 may be electrically connected to the second through vias 250 of the first semiconductor chip 200 or may be electrically connected to the third through vias 350 of the corresponding semiconductor chips 300. The lower pads LPD of the second connecting structures CS2 may include a conductive material.

The connecting bump CBP of each second connecting structure CS2 may be provided between the upper pad UPD and the lower pad LPD in the second connecting structure CS2. The connecting bump CBP of the second connecting structure CS2 may electrically interconnect the upper pad UPD and the lower pad LPD in the second connecting structure CS2. The connecting bump CBP of the second connecting structure CS2 may include a conductive material. For example, the connecting bumps CBP may include a solder ball and/or pillar, and may include a solder, though the example embodiments of the disclosure are not limited thereto.

The first and second connecting structures CS1 and CS2 may electrically interconnect the base structure 100 and the first to third semiconductor chips 200, 300 and 400.

Adhesive layers AD may be provided among the first to third semiconductor chips 200, 300, and 400. In some embodiments, the adhesive layers AD may be provided between a second semiconductor chip 300 and an adjacent semiconductor chip (e.g., between the first semiconductor chip 200 and an adjacent second semiconductor chip 200, between adjacent semiconductor chips 300, and/or and between the third semiconductor chip 400 and the second semiconductor chip 300 adjacent to the third semiconductor chip 400, respectively). The first semiconductor chip 200 and the second semiconductor chip 300 adjacent to the first semiconductor chip 200 may be spaced apart from each other in the third direction D3 with a corresponding one of the adhesive layers AD is interposed therebetween. The adjacent second semiconductor chips 300 may be spaced apart from each other in the third direction D3 with a corresponding one of the adhesive layers AD is interposed therebetween. The third semiconductor chip 400 and the second semiconductor chip 300 adjacent to the third semiconductor chip 400 may be spaced apart from each other in the third direction D3 with a corresponding one of the adhesive layers AD is interposed therebetween. The adhesive layers AD may bond the first to third semiconductor chips 200, 300, and 400 to each other. The adhesive layers AD may surround corresponding ones of the second connecting structures CS2, respectively.

A molding layer MD covering the first semiconductor chip 200, the second semiconductor chips 300 and the adhesive layers AD may be provided. The molding layer MD may be provided on the base structure 100. The molding layer MD may include a base portion surrounding the first to third semiconductor chips 200, 300, and 400, and the adhesive layers AD, and an interposition portion IN interposed between the base structure 100 and the first semiconductor chip 200. The base portion BA of the molding layer MD may surround the interposition portion IN of the molding layer MD. Although the molding layer MD is described under the condition that the molding layer MD is divided into the base portion BA and the interposition portion IN (for convenience of description), the molding layer MD may have an integrated structure in which the base portion BA and the interposition portion IN are connected to each other without having a boundary. The base portion BA and the interposition portion IN of the molding layer MD may include the same material.

The interposition portion IN of the molding layer MD may surround the first connecting structures CS1. The interposition portion IN of the molding layer MD may be disposed at the same level as the first connecting structures CS1. The base structure 100 and the first semiconductor chip 200 may be spaced apart from each other in the third direction D3 with the interposition portion IN of the molding layer MD is interposed therebetween. The interposition portion IN of the molding layer MD may overlap with the base structure 100, the first to third semiconductor chips 200, 300, and 400, and the adhesive layers AD in the third direction D3. The width of the interposition portion IN of the molding layer MD in the first direction D1 may be equal to and/or defined by the width of the first to third semiconductor chips 200, 300, and 400 in the first direction D1. For example, the horizontal width of the interposition portion IN of the molding layer MD may be equal to the horizontal width of the first to third semiconductor chips 200, 300, and 400.

Referring to FIG. 1B, a bottom surface 1NB of the interposition portion IN of the molding layer MD may contact a top surface TS1 of the base structure 100. The bottom surface 1NB of the interposition portion IN of the molding layer MD may contact a top surface of the first upper protective layer 140 of the base structure 100 (e.g., the top surface TS1). A top surface INT of the interposition portion IN of the molding layer MD may contact a bottom surface BS1 of the first semiconductor chip 200. The interposition portion IN of the molding layer MD may cover an overall portion of the bottom surface BS1 of the first semiconductor chip 200. The top surface INT of the interposition portion IN of the molding layer MD may contact a bottom surface of the second lower protective layer 230 of the first semiconductor chip 200, that is, the bottom surface BS1. The interposition portion IN of the molding layer MD may cover an overall portion of the lower surface BS1 of the second lower protective layer 230.

The interposition portion IN of the molding layer MD may contact each first connecting structure CS1. A sidewall INS of the interposition portion IN of the molding layer MD may contact a sidewall SW1 of the first connecting structure CS1. The interposition portion IN of the molding layer MD and the second lower protective layer 230 of the first semiconductor chip 200 may cover an overall portion and/or an exposed portion of the sidewall SW1 of the first connecting structure CS1. The interposition portion IN of the molding layer MD may contact the upper pad UPD, the lower pad LPD, and the connecting bump CBP of the first connecting structure CS1.

The base portion BA of the molding layer MD may contact a sidewall SW2 of the first semiconductor chip 200. The base portion BA of the molding layer MD may cover an overall portion of a sidewall SW3 of the second lower protective layer 230 in the first semiconductor chip 200.

The level of the bottom surface 1NB of the interposition portion IN in the molding layer MD may be equal to the level of a bottom surface BS2 of the first connecting structure CS1. For example, the bottom surface 1NB of the interposition portion IN of the molding layer MD may be coplanar with the bottom surface BS2 of the first connecting structure CS1. The level of the bottom surface 1NB of the interposition portion IN in the molding layer MD may be equal to the level of a bottom surface of the lower pad LPD, that is, the bottom surface BS2, in the first connecting structure CS1. The bottoms surface 1NB of the interposition portion IN of the molding layer MD may be coplanar with the bottom surface BS2 of the lower pad LPD of the first connecting structure CS1.

The level of the top surface INT of the interposition portion IN of the molding layer MD may be lower than the level of the top surface TS2 of the first connecting structure CS1. The level of the top surface INT of the interposition portion IN in the molding layer MD may be a level between the top surface TS2 of the upper pad UPD of the first connecting structure CS1 and a bottom surface of the upper pad UPD.

The adhesive layer AD interposed between the first semiconductor chip 200 and the second semiconductor chip 300 adjacent to the first semiconductor chip 200 from among the adhesive layers AD may be defined as a first adhesive layer AD1. The first adhesive layer AD1 may contact a top surface TS3 of the first semiconductor chip 200 and at least a portion of the sidewall SW2 of the first semiconductor chip 200. The first adhesive layer AD1 may cover an overall portion of the top surface TS3 of the first semiconductor chip 200. The first adhesive layer AD1 may cover an overall portion of a top surface of the second upper protective layer 240, that is, the top surface TS3, in the first semiconductor chip 200. The first adhesive layer AD1 may cover an overall portion of a sidewall SW4 of the second upper protective layer 240 in the first semiconductor chip 200. The second upper protective layer 240 of the first semiconductor chip 200 may be spaced apart from the base portion BA of the molding layer MD by the first adhesive layer AD1.

The first adhesive layer AD1 may contact a bottom surface BS3 and at least a portion of a sidewall SW5 of the second semiconductor chip 300 adjacent to the first semiconductor chip 200. The first adhesive layer AD1 may cover an overall portion of a bottom surface of the third lower protective layer 330, that is, the bottom surface BS3, in the second semiconductor chip 300 adjacent to the first semiconductor chip 200. The first adhesive layer AD1 may cover an overall portion of a side wall SW6 of the third lower protective layer 330 in the second semiconductor chip 300 adjacent to the first semiconductor chip 200. The third lower protective layer 330 of the second semiconductor chip 300 adjacent to the first semiconductor chip 200 may be spaced apart from the base portion BA of the molding layer MD by the first adhesive layer AD1.

The first adhesive layer AD1 may contact corresponding ones of the second connecting structures CS2. The first adhesive layer AD may contact a sidewall of each of the corresponding second connecting structures CS2. The level of a lowermost portion of the adhesive layer AD1 may be lower than the level of the top surface TS3 of the first semiconductor chip 200. The level of an uppermost portion of the adhesive layer AD1 may be higher than the level of the bottom surface BS3 of the second semiconductor chip 300.

The adhesive layers AD provided between the adjacent second semiconductor chips 300 and between the third semiconductor chip 400 and the second semiconductor chip 300 adjacent to the third semiconductor chip 400 may be similar to the first adhesive layer AD1.

The distance between the base structure 100 and the first semiconductor chip 200 in the third direction D3 may be defined as a first distance L1. For example, the distance between the top surface TS1 of the base structure 100 and the bottom surface BS1 of the first semiconductor chip 200 in the third direction D3 may be defined as the first distance L1. The distance between the bottom surface 1NB and the top surface INT of the interposition portion IN of the molding layer MD in the third direction D3 may be equal to the first distance L1. The width of the interposition portion IN of the molding layer MD in the third direction D3 may be equal to the first distance L1. For example, the vertical width of the interposition portion IN of the molding layer MD may be equal to the first distance L1.

The distance between the first semiconductor chip 2000 and the second semiconductor chip 300 adjacent to the first semiconductor chip 200 in the third direction D3 may be defined as a second distance L2. For example, the distance between the top surface TS3 of the first semiconductor chip 200 and the bottom surface BS3 of the second semiconductor chip 300 adjacent to the first semiconductor chip 200 in the third direction D3 may be defined as the second distance L2. The minimum width of the first adhesive layer AD1 in the third direction D3 may be equal to the second distance L2. For example, the minimum vertical width of the first adhesive layer AD1 may be equal to the second distance L2. The distance between the adjacent second semiconductor chips 300 in the third direction D3 and the distance between the third semiconductor chip 400 and the second semiconductor chip 300 adjacent to the third semiconductor chip 400 in the third direction D3 may be equal to the second distance L2.

The first distance L1 and the second distance L2 may be different. In some embodiments, the first distance L1 may be smaller than the second distance L2. In some embodiments, the first distance L1 and the second distance L2 may be about 5 to about 20 μm.

Referring to FIG. 1C, the molding layer MD may include a first material layer ML1 and first fillers FI1. Each of the base portion BA and the interposition portion IN of the molding layer MD may include a part of the first material layer ML1 and the first fillers FI1. The first material layer ML1 may surround the first fillers FI1. For example, the first fillers FI1 may be provided in the first material layer ML1. The first material layer ML1 may include a polymer material. For example, the first material layer ML1 may include an epoxy resin. The first fillers FI1 may include a ceramic material. For example, the first fillers FI1 may include silicon oxide.

In some example embodiments, the content of the first fillers FI1 of the molding layer MD may be 70 wt % or more. In some example embodiments, the molding layer MD may have a Young's modulus of about 5 to about 20 GPa at 25° C. For example, the molding layer MD may have a glass transition temperature of 90° C. to 200° C. For example, the molding layer MD may have a coefficient of thermal expansion of 5 to 40 ppm at a temperature not higher than the glass transition temperature and may have a coefficient of thermal expansion of 20 to 100 ppm at a temperature higher than the glass transition temperature. In some example embodiments, the maximum diameter of the first fillers FI1 may be 5 μm or less.

At least one of the adhesive layers (e.g., the first adhesive layer AD1) may include a material different from that of the molding layer MD. A boundary dividing the first adhesive layer AD1 and the molding layer MD from each other may be formed between the first adhesive layer AD1 and the molding layer MD. The first adhesive layer AD1 may include a second material layer ML2 and second fillers FI2. The second material layer ML2 may surround the second fillers FI2. For example, the second fillers FI2 may be provided in the second material layer ML2. The second material layer ML2 may include a material different from that of the first material layer ML1. The second material layer ML2 may include an adhesive polymer material. The second fillers FI2 may include a ceramic material. For example, the second fillers FI2 may include silicon oxide.

In some example embodiments, the content of the first fillers FI1 of the molding layer MOD may be 1.5 to 2.5 times the content of the second fillers FI2 of the first adhesive layer AD1. In some example embodiments, the average diameter of the second fillers FI2 may be smaller than the average diameter of the first fillers FI1.

The adhesive layers AD provided between the adjacent semiconductor chips 300 and between the third semiconductor chip 400 and the second semiconductor chip 300 adjacent to the third semiconductor chip 400 may include the second material layer ML2 and the second fillers FI2, substantially identically to the first adhesive layer AD1.

In the semiconductor package according to some example embodiments of the disclosure, a triple point where the protective layer (e.g., the upper protective layer and/or the lower protective layer), the molding layer MD and the adhesive layer AD contact may not be formed because the interposition portion IN of the molding layer MD is provided between the base structure 100 and the first semiconductor chip 200. Accordingly, a phenomenon in which stress is concentrated on the triple point may be prevented and, as such, reliability of the semiconductor package may be enhanced.

FIGS. 2A, 2B, 2C, 2D, 2E, 2F, 2G, 2H, 2I, 2J, 2K, and 2L are sectional views explaining a method for manufacturing a semiconductor package in accordance with some example embodiments of the disclosure.

Figure 2A:
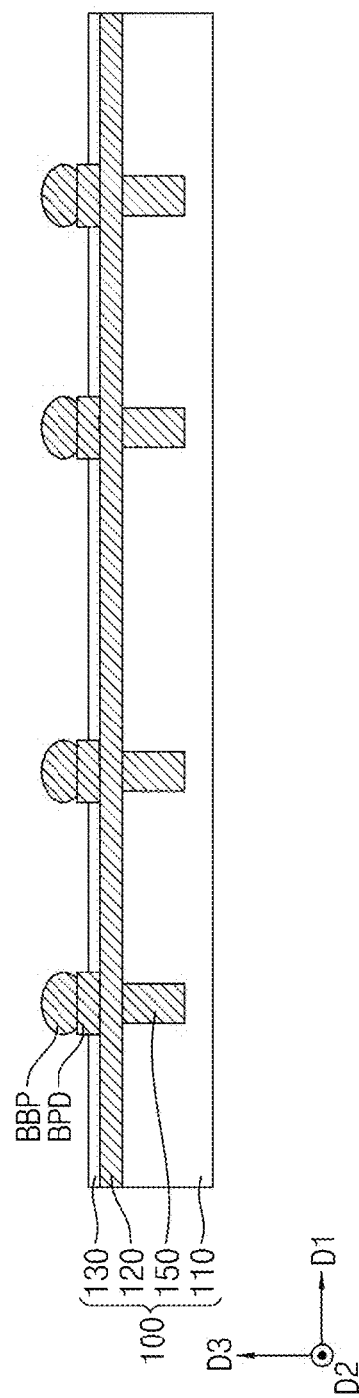

Referring to FIG. 2A, a base structure 100 including a first substrate 110, a first wiring layer 120, a first lower protective layer 130, and first through vias 150 may be formed. In some embodiments, formation of the first structure 110 may include forming the first substrate 110, forming the first through vias 150 in the first substrate 110, forming the first wiring layer 120 on the first substrate 110, and forming the first lower protective layer 130 on the first wiring layer 120. Base pads BPD may be formed on the base structure 100. Base bumps BBP may be formed on the base pads BPD, respectively.

Referring to FIG. 2B, the base structure 100 may be attached to a first carrier substrate CAR1 using a first glue layer GL1.

The first lower protective layer 130 of the base structure 100 may contact the first glue layer GL1. The base bumps BBP may be surrounded by the first glue layer GL1. For example, the first glue layer GL1 may include an acrylic polymer.

Figure 2C:
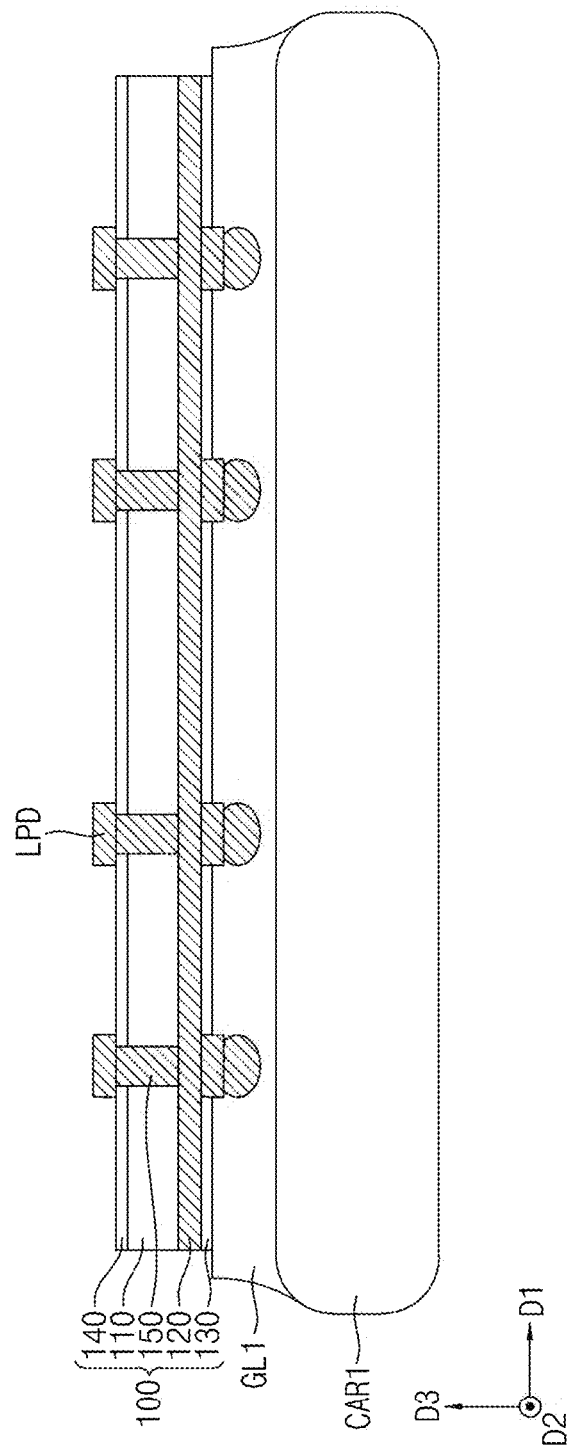

Referring to FIG. 2C, a portion of the first substrate 110 of the base structure 100 may be removed. For example, the portion of the first substrate 110 may be removed through an etch-back process and/or a grinding process. As the portion of the first substrate 110 is removed, an end of the first through vias 150 may be exposed. A first upper protective layer 140 may be formed on the first substrate 110. In some embodiments, formation of the first upper protective layer 140 may include forming, on the first substrate 110, a first preliminary upper protective layer covering the first through vias 150, and removing an upper portion of the first preliminary upper protective layer, thereby forming the first upper protective layer 140 exposing the first through vias 150. Lower pads LPD may be formed on the first through vias 150, respectively.

Figure 2D:
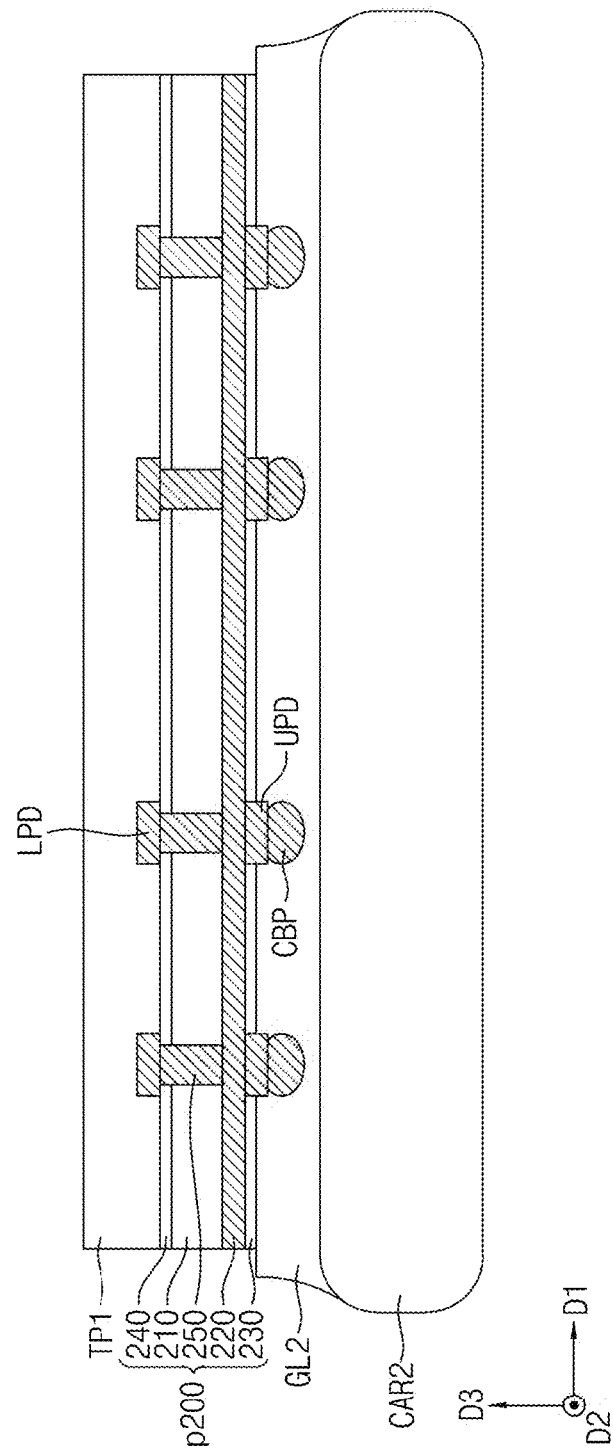

Referring to FIG. 2D, a first preliminary semiconductor chip p200 including a second substrate 210, a second wiring layer 220, a second lower protective layer 230, second through vias 250, upper pads UPD, and connecting bumps CBP may be formed through processes similar to the above-described processes. The first preliminary semiconductor chip p200 may be attached to a second carrier substrate CAR2 using a second glue layer GL2. A second upper protective layer 240 may be formed on the second substrate 210. Lower pads LPD may be formed on the second through vias 250, respectively.

A first tape TP1 covering the second upper protective layer 240 of the first preliminary semiconductor chip p200 and the lower pads LPD may be formed. The first tape TP1 may contact the second upper protective layer 240 of the first preliminary semiconductor chip p200 and the lower pads LPD.

Referring to FIG. 2E, the first preliminary semiconductor chip p200 may be inverted using the first tape TP1. As the first preliminary semiconductor chip p200 is inverted, the second carrier substrate CAR2 and the second glue layer GL2 may be disposed over the first preliminary semiconductor chip p200.

The second carrier substrate CAR2 and the second glue layer GL2 may be removed. As the second carrier substrate CAR2 and the second glue layer GL2 are removed, the upper pads UPD and the connecting bumps CBP on the first preliminary semiconductor chip p200 may be exposed.

Figure 2F:
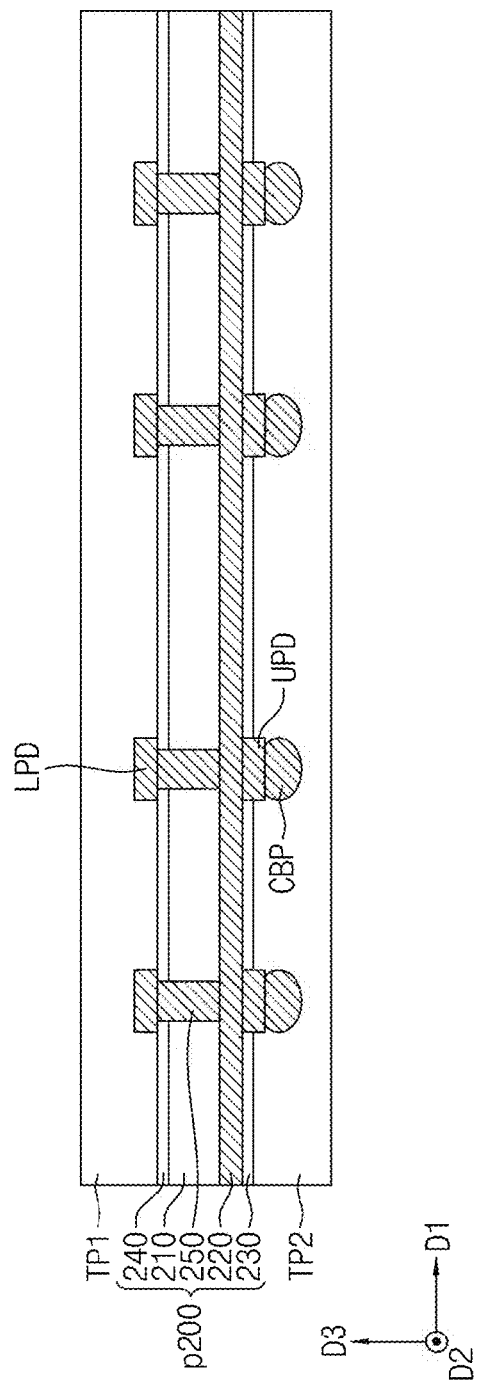

Referring to FIG. 2F, a second tape TP2 covering the second lower protective layer 230 of the first preliminary semiconductor chip p200, the upper pads UPD and the connecting bumps CBP may be formed. The second tape TP2 may contact the second lower protective layer 230 of the first preliminary semiconductor chip p200, the upper pads UPD and the connecting bumps CBP. The first preliminary semiconductor chip p200 may be inverted using the first tape TP1 and the second tape TP2. As the first preliminary semiconductor chip p200 is inverted, the first tape TP1 may be disposed over the first preliminary semiconductor chip p200.

In some embodiments, it may be possible to remove the second glue layer GL2 and the second carrier substrate CAR2 without using the process of inverting the first preliminary semiconductor chip p200, differently from the above-described procedure, and, as such, the second tape TP2 may be formed.

Figure 2G:
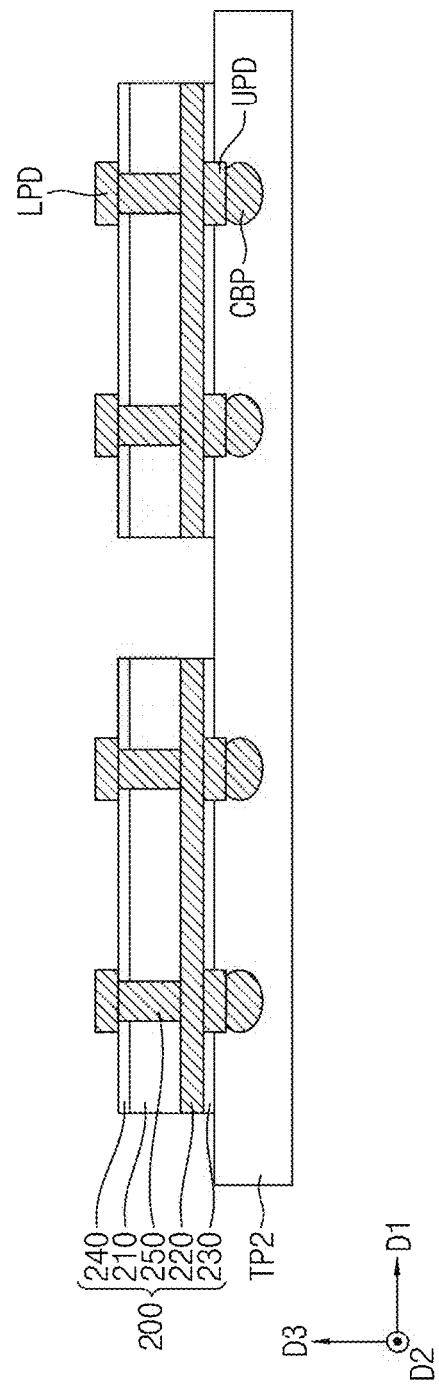

Referring to FIG. 2G, the first preliminary semiconductor chip p200 may be divided into a plurality of first semiconductor chips 200. In some embodiments, division of the first preliminary semiconductor chip p200 into the plurality of first semiconductor chips 200 may include removing the first tape TP1 on the first preliminary semiconductor chip p200, and dividing the first preliminary semiconductor chip p200 into the plurality of first semiconductor chips 200. The first preliminary semiconductor chip p200 may be divided into the first semiconductor chips 200 through a dicing process. The divided first semiconductor chips 200 may be connected by the second tape TP2.

Division of the first preliminary semiconductor chip p200 into the plurality of first semiconductor chips 200 may include dividing the second upper protective layer 240 into a plurality of pieces, dividing the second substrate 210 into a plurality of pieces, dividing the second wiring layer 220 into a plurality of pieces, and dividing the second lower protective layer 230 into a plurality of pieces.

Figure 2H:
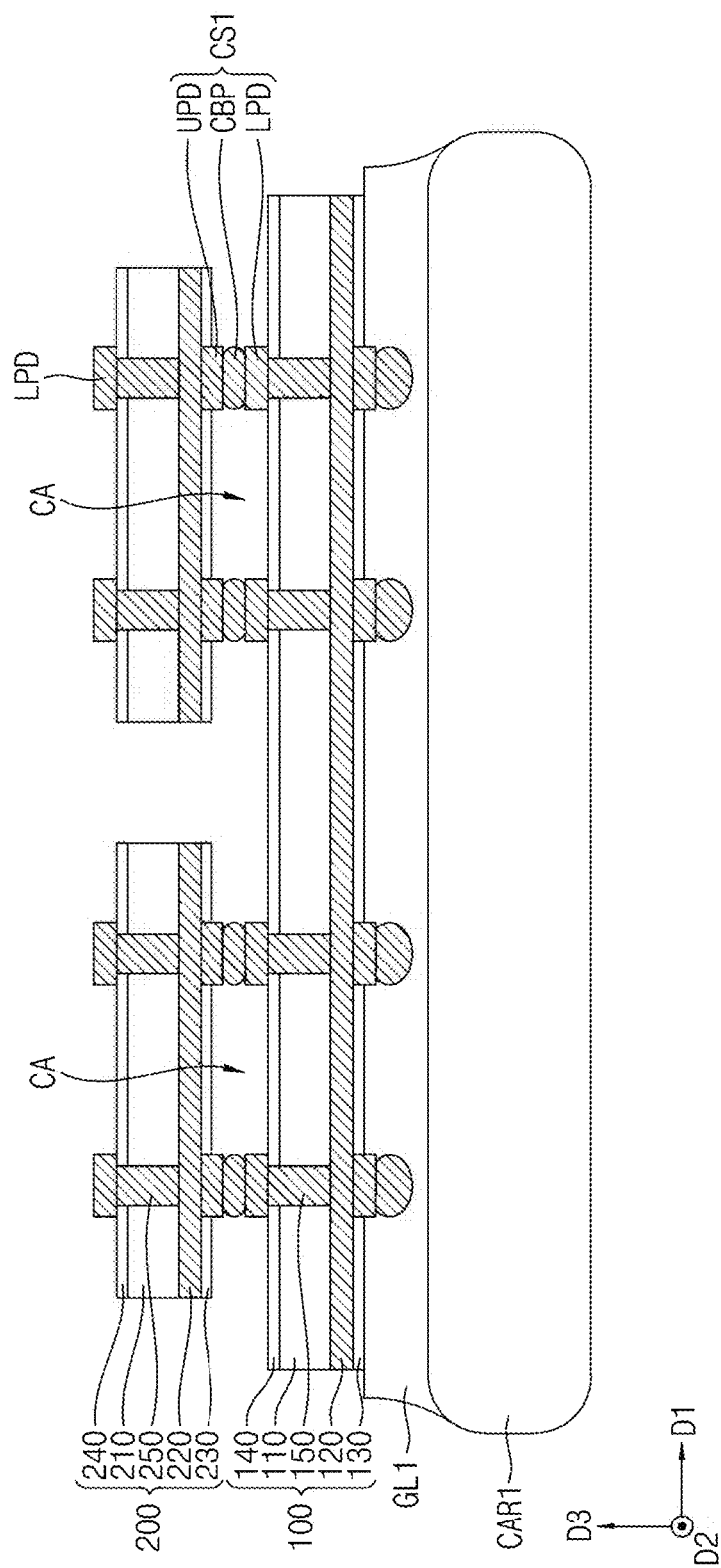
Figure 21:
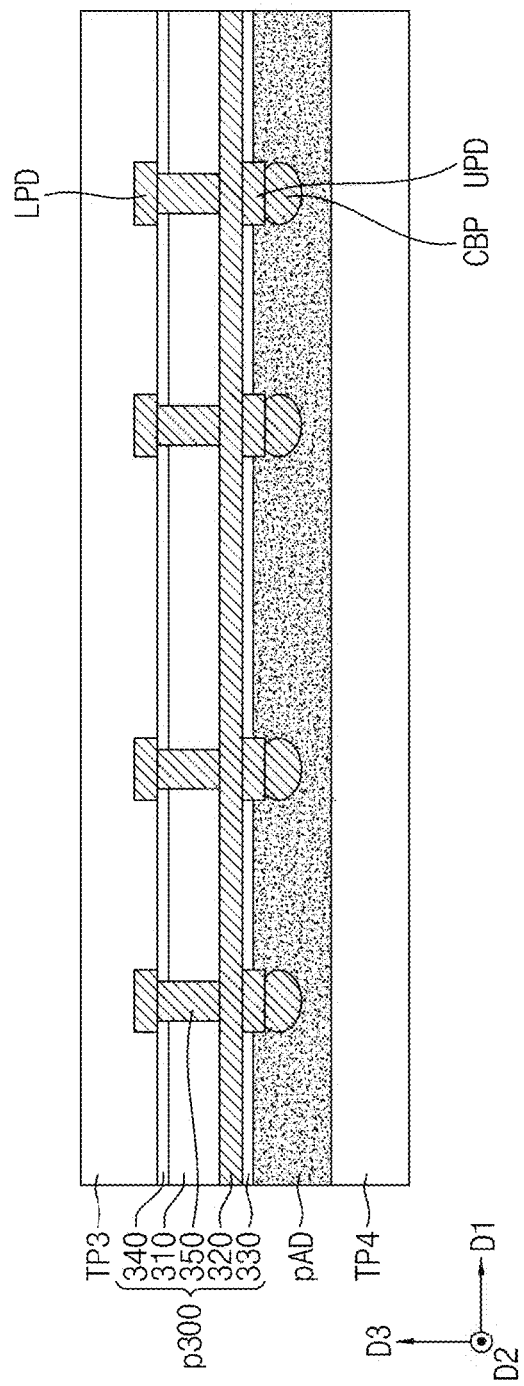

Referring to FIG. 2H, each of the first semiconductor chips 200 may be provided over the base structure 100. Each first semiconductor chip 200 may be mounted on the base structure 100. Provision of the first semiconductor chip 200 over the base structure 100 may include separating the first semiconductor chip 200 from the second tape TP2, and bonding the connecting bumps CBP connected to the first semiconductor chip 200 and lower pads LPD connected to the base structure 100, respectively. For example, the connecting bumps CBP connected to the first semiconductor chip 200 and the lower pads LPD connected to the base structure 100 may be bonded to each other through a thermal compression process, a mass reflow process and/or a laser assisted bonding process.

As the connecting bumps CBP connected to the first semiconductor chip 200 and the lower pads LPD connected to the base structure 100 are bonded to each other, first connecting structures CS1 each including corresponding ones of the upper pads UPD, the connecting bumps CBP, and the lower pads LPD may be formed.

The first semiconductor chip 200 and the base structure 100 may be spaced apart from each other in a third direction D3 under the condition that the first connecting structures CS1 are interposed therebetween. An empty space provided between the first semiconductor chip 200 and the base structure 100 may be defined as a cavity CA. A space between a bottom surface of the first semiconductor chip 200 and a top surface of the base structure 100 may be defined as the cavity CA.

The first connecting structures CS1 may be exposed by the cavity CA. The top surface of the base structure 100 and the bottom surface of the first semiconductor chip 200 may be exposed by the cavity CA. The cavity CA may expose an overall portion of the bottom surface of the first semiconductor chip 200. The cavity CA may expose an overall portion of a bottom surface of the second lower protective layer 230.

Referring to FIG. 2I, a second preliminary semiconductor chip p300 including a third substrate 310, a third wiring layer 320, a third lower protective layer 330, a third upper protective layer 340, third through vias 350, upper pads UPD, lower pads LPD, and connecting bumps CBP may be formed through processes similar to the above-described processes. A third tape TP3 covering the third upper protective layers 340 of the second preliminary semiconductor chip p300 and the lower pads LPD may be formed. The third tape TP3 may contact the third upper protective layer 340 of the second preliminary semiconductor chip p300 and the lower pads LPD.

A preliminary adhesive layer pAD covering the third lower protective layer 330 of the second preliminary semiconductor chip p300, the upper pads UPD and the connecting bumps CBP, and a fourth tape TP4 supporting the preliminary adhesive layer pAD may be formed. The preliminary adhesive layer pAD may contact the third lower protective layer 330 of the second preliminary semiconductor chip p300, the upper pads UPD, and the connecting bumps CBP. The fourth tape TP4 may be spaced apart from the third lower protective layer 330 of the second preliminary semiconductor chip p300, the upper pads UPD and the connecting bumps CBP. In some embodiments, formation of the fourth tape TP4 and the preliminary adhesive layer pAD may include providing the fourth tape TP4, forming the preliminary adhesive layer pAD on the fourth tape TP4, and attaching the second preliminary semiconductor chip p300 to the preliminary adhesive layer pAD. For example, the preliminary adhesive layer pAD may include an adhesive polymer material and a ceramic material.

Figure 2J:
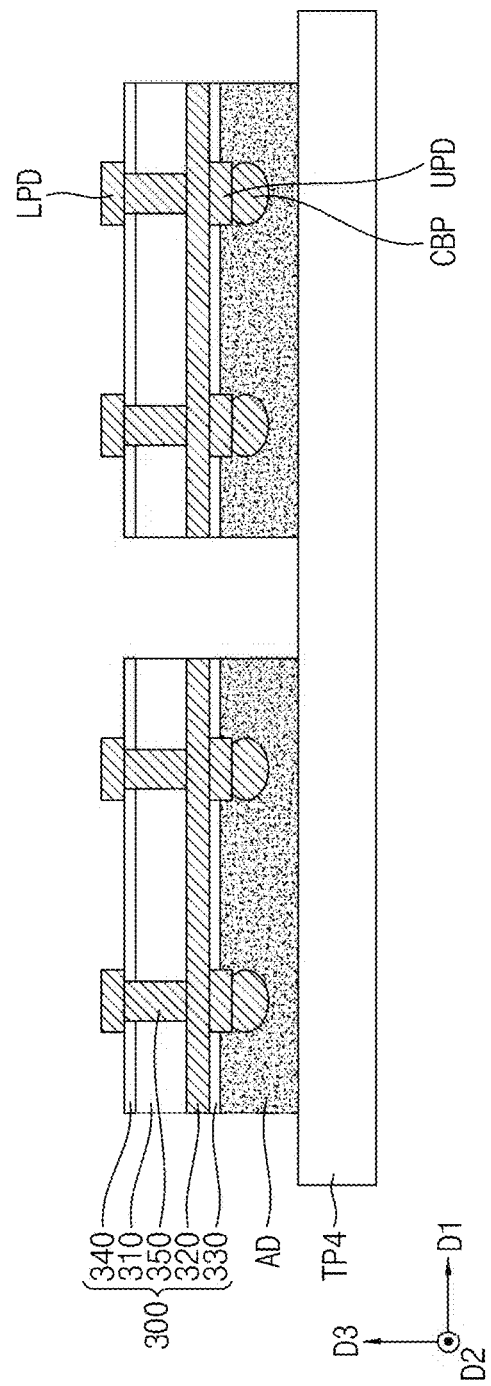

Referring to FIG. 2J, the second preliminary semiconductor chip p300 may be divided into a plurality of second semiconductor chips 300, and the preliminary adhesive layer pAD may be divided into a plurality of adhesive layers AD. For example, the second preliminary semiconductor chip p300 and the preliminary adhesive layer pAD may be simultaneously divided into the second semiconductor chips 300 and the adhesive layers AD through one-time execution of a dicing process. In some embodiments, the second preliminary semiconductor chip p300 and the preliminary adhesive layer pAD may be divided after removal of the third tape TP3. The divided second semiconductor chips 300 and the divided adhesive layers AD may be connected by the fourth tape TP4.

Figure 2K:
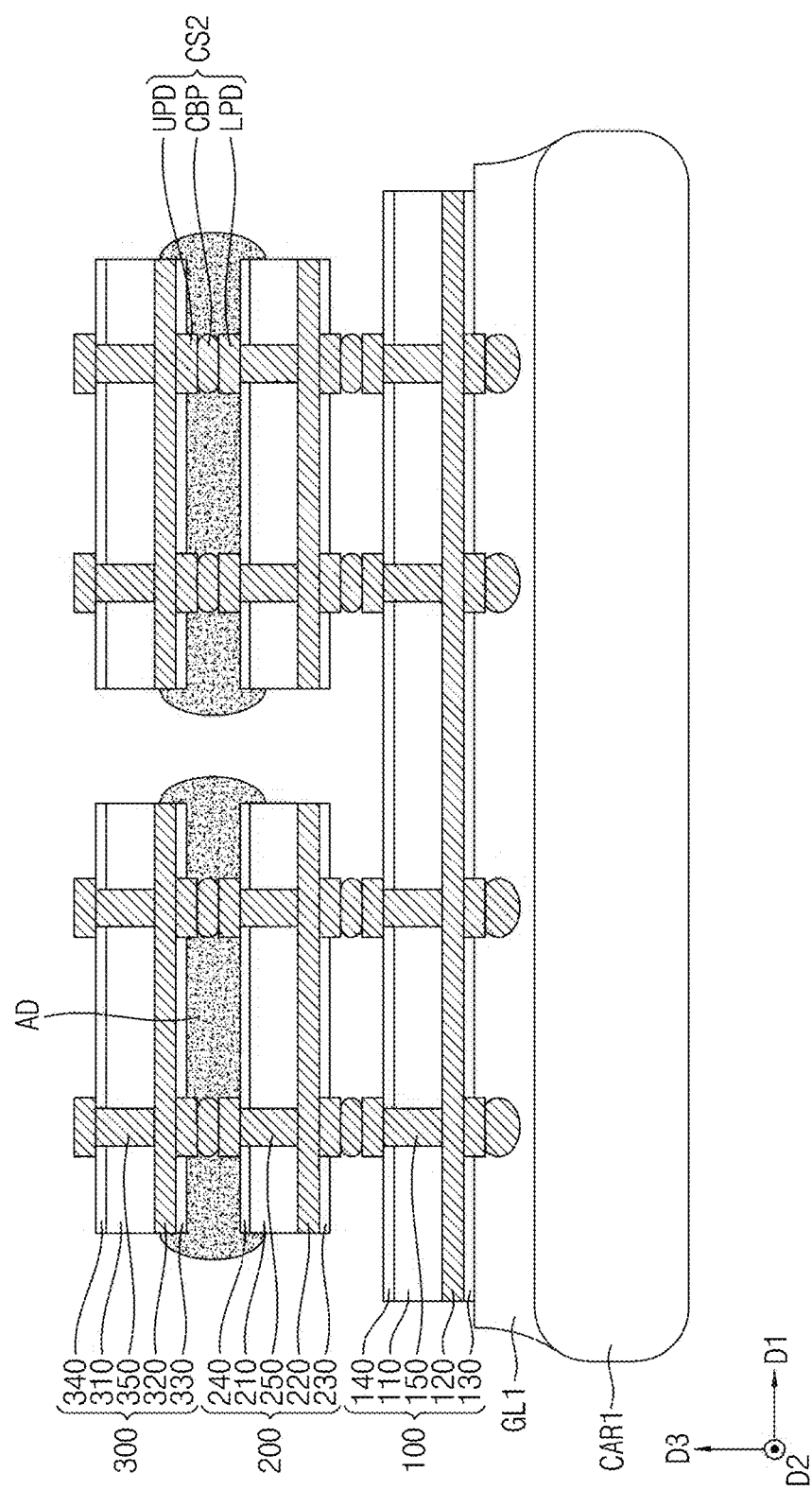

Referring to FIG. 2K, the second semiconductor chips 300 may be provided over the first semiconductor chips 200, respectively. The second semiconductor chips 300 may be mounted on the first semiconductor chips 200, respectively. Provision of the second semiconductor chips 300 over the first semiconductor chips 200 may include separating the second semiconductor chips 300 and the adhesive layers AD from the fourth tape TP4, bonding the connecting bumps CBP connected to each of the second semiconductor chips 300 and the lower pads LPD connected to a corresponding one of the first semiconductor chips 200, attaching the second semiconductor chip 300 and the first semiconductor chip 200 using a corresponding one of the adhesive layers AD. For example, the connecting bumps CBP connected to the second semiconductor chip 300 and the lower pads LPD connected to the first semiconductor chip 200 may be bonded to each other through a thermal compression process and/or a mass reflow process.

As the second semiconductor chip 300 is provided over the first semiconductor chip 200, the shape of the adhesive layer AD between the second semiconductor chip 300 and the first semiconductor chip 200 may be varied. As the connecting bumps CBP connected to the second semiconductor chip 300 and the lower pads LPD connected to the first semiconductor chip 200 are bonded to each other, second connecting structures CS2 each including corresponding ones of the upper pads UPD, the connecting bumps CBP and the lower pads LPD may be formed.

Figure 2L:
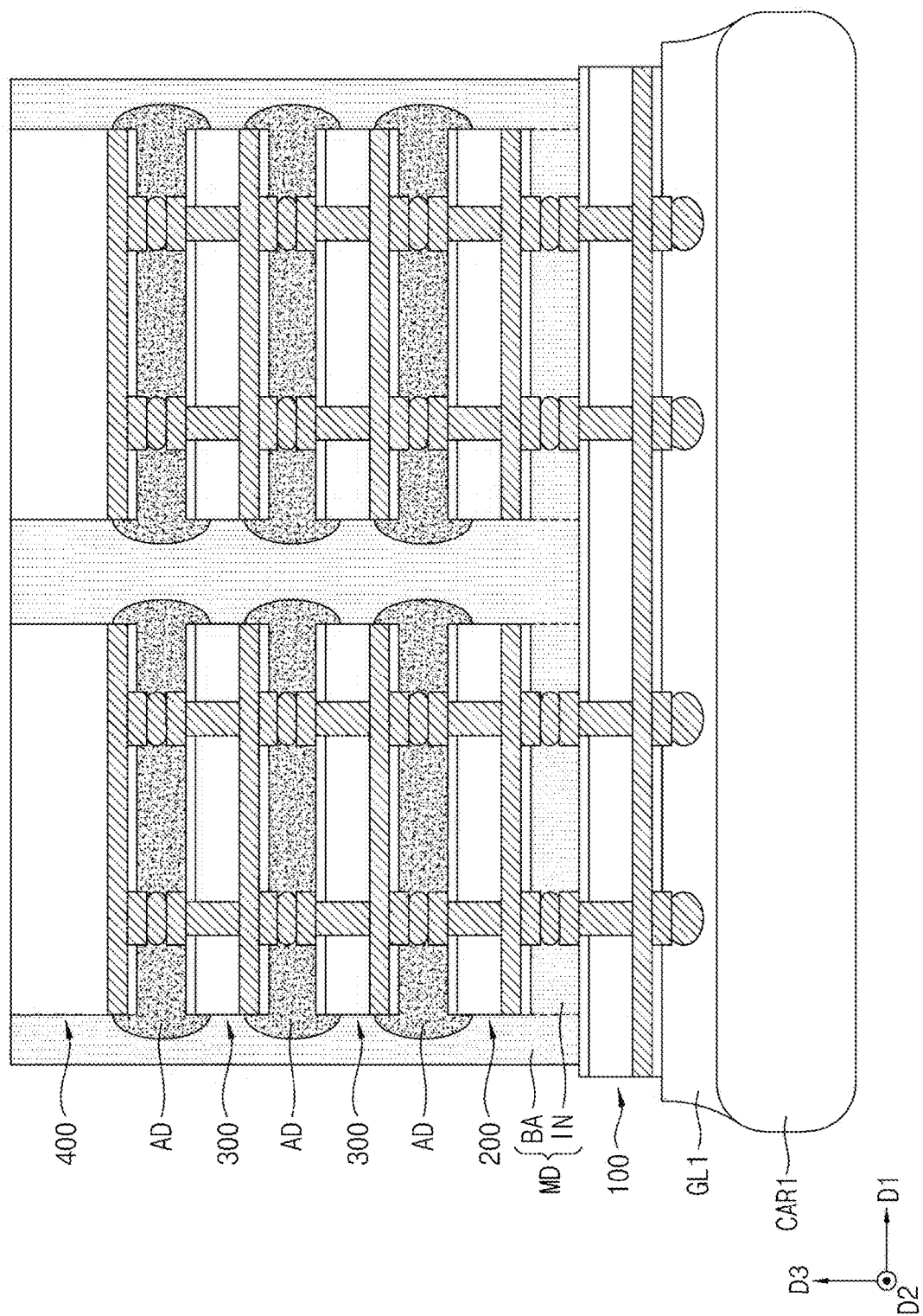

Referring to FIG. 2L, the second semiconductor chips 300 and a third semiconductor chip 400 may be sequentially provided over the base structure 100 through processes similar to the above-described processes. Adhesive layers AD may be formed between adjacent ones of the second semiconductor chips and between the third semiconductor chip 400 and the second semiconductor chip 300 adjacent to the third semiconductor chip 400, respectively. The base structure 100, the first to third semiconductor chips 200, 300 and 400, and the adhesive layers AD may overlap with the cavity CA (cf. FIG. 2H) in the third direction D3.

A molding layer MD covering the top surface of the base structure 100 and the first to third semiconductor chips 200, 300, and 400 may be formed. The molding layer MD may fill the cavity CA between the first semiconductor chip 200 and the base structure 100. An interposition portion IN of the molding layer MD may fill the cavity CA between the first semiconductor chip 200 and the base structure 100.

The first carrier substrate CAR1 and the first glue layer GL1 may be separated from the base structure 100. After separation of the first carrier substrate CAR1 and the first glue layer GL1 from the base structure 100, the base structure 100 may be divided into a plurality of base structures 100, and the molding layer MD may be divided into a plurality of molding layers MD. For example, the base structure 100 and the molding layer MD may be divided through a dicing process.

In the semiconductor package manufacturing method according to the example embodiments of the disclosure, the adhesive layers AD are formed between the first semiconductor chip 200 and the second semiconductor chip 300 adjacent to the first semiconductor chip 200, between the adjacent second semiconductor chips 300, and between the third semiconductor chip 400 and the second semiconductor chip 300 adjacent to the third semiconductor chip 400, respectively, and the interposition portion IN of the molding layer MD may be formed between the first semiconductor chip 200 and the base structure 100. Since the number of regions where the interposition portion IN of the molding layer MD is formed is relatively small, difficulty of the process for forming the molding layer MD may be relatively small.

FIG. 3 is a sectional view of a semiconductor package according to some example embodiments of the disclosure.

Referring to FIG. 3, a semiconductor package 2 may include a molding layer MDa including a base portion Baa and an interposition portion INa. The interposition portion INa of the molding layer MDa may be interposed between a third semiconductor chip 400 and a second semiconductor chip 300 adjacent to the third semiconductor chip 400. The semiconductor package 2 may include adhesive layers ADa. The adhesive layers ADa may be interposed between a base structure 100 and a first semiconductor chip 200, between the first semiconductor chip 200 and a second semiconductor chip 300 adjacent to the first semiconductor chip 200, and between the second semiconductor chips 300, respectively.

Figure 4:
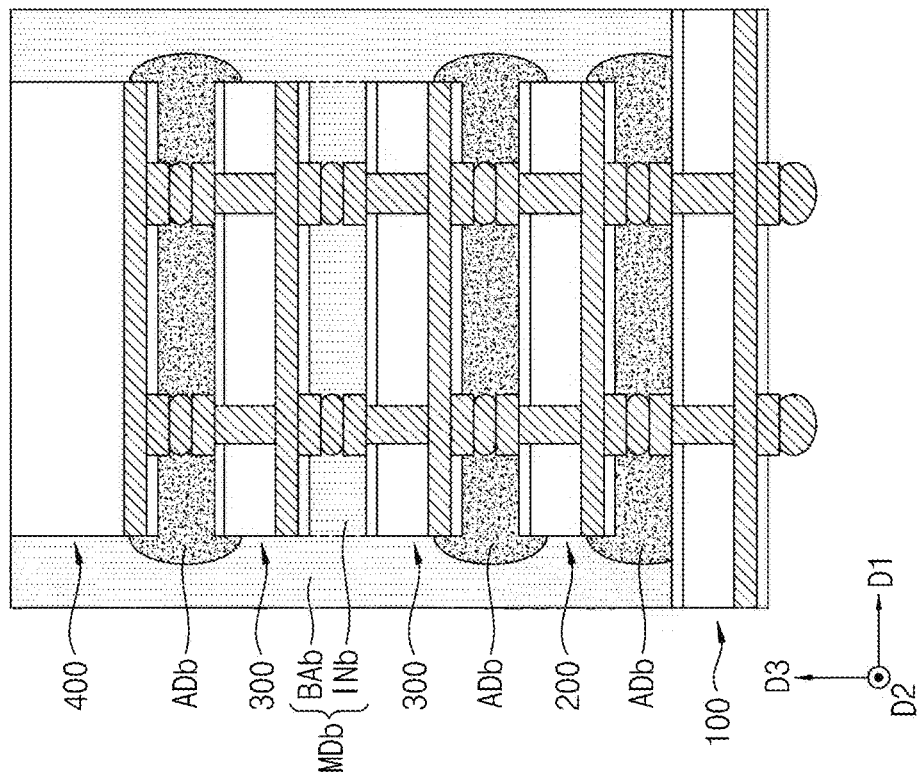
FIG. 4 is a sectional view of a semiconductor package according to some example embodiments of the disclosure.

FIG. 4 is a sectional view of a semiconductor package according to some example embodiments of the disclosure.

Referring to FIG. 4, a semiconductor package 3 may include a molding layer MDb including a base portion Bab and an interposition portion INb. The interposition portion INb of the molding layer MDb may be interposed between second semiconductor chips 300. The semiconductor package 3 may include adhesive layers ADb. The adhesive layers ADb may be interposed between a base structure 100 and a first semiconductor chip 200, between the first semiconductor chip 200 and the second semiconductor chip 300 adjacent to the first semiconductor chip 200, and between a third semiconductor chip 400 and the second semiconductor chip 300 adjacent to the third semiconductor chip 400, respectively.

Although the interposition portion INb of the molding layer MDb is shown and described as being interposed between the second semiconductor chips 300, the example embodiments of the disclosure are not limited thereto. In some embodiments, the interposition portion INb of the molding layer MDb may be provided between the first semiconductor chip 200 and the second semiconductor chip 300 adjacent to the first semiconductor chip 200, differently from the case as shown in FIG. 4.

Figure 5:
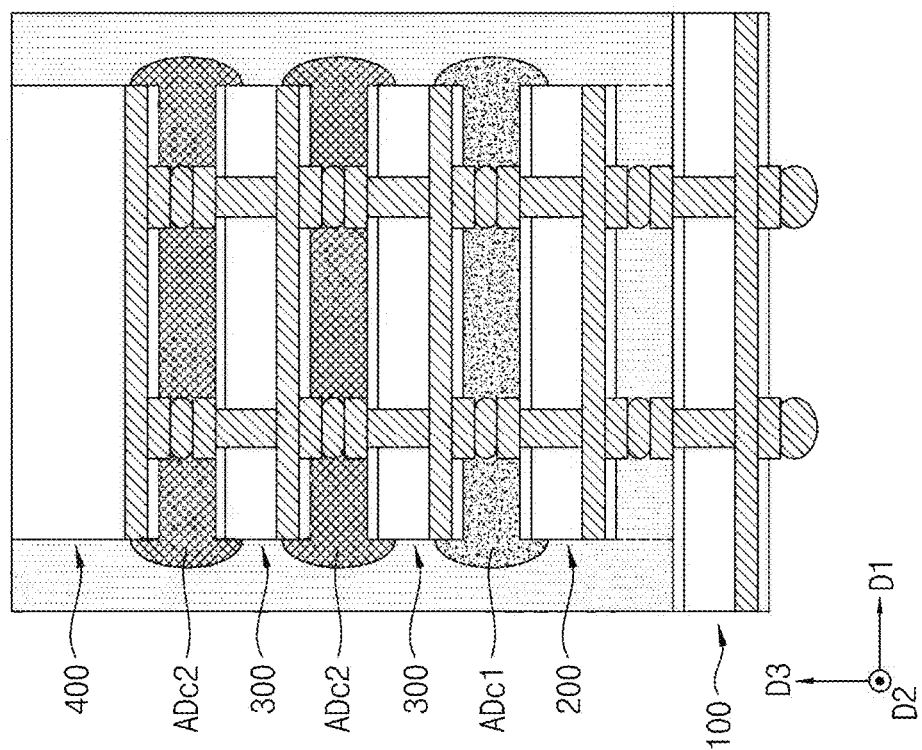
FIG. 5 is a sectional view of a semiconductor package according to some example embodiments of the disclosure.

FIG. 5 is a sectional view of a semiconductor package according to some example embodiments of the disclosure.

Referring to FIG. 5, a semiconductor package 4 may include a first adhesive layer ADc1 and second adhesive layers ADc2. The first adhesive layer ADc1 may be interposed between a first semiconductor chip 200 and a second semiconductor chip 300 adjacent to the first semiconductor chip 200 from among second semiconductor chips 300. The second adhesive layers ADc2 may be interposed between adjacent ones of the second semiconductor chips 300 and between a third semiconductor chip 400 and a second semiconductor chip 300 adjacent to the third semiconductor chip 400 from among the second semiconductor chips 300, respectively.

The first adhesive layer ADc1 may include a material different from that of each second adhesive layer ADc2. For example, the first adhesive layer ADc1 and the second adhesive layer ADc2 may include different adhesive polymer materials and/or different concentrations of ceramics, respectively. The distance between the first semiconductor chip 200 and the second semiconductor chip 300 adjacent to the first semiconductor chip 200 in a third direction D3 may differ from the distance between the adjacent second semiconductor chips 300 in the third direction D3. The distance between the first semiconductor chip 200 and the second semiconductor chip 300 adjacent to the first semiconductor chip 200 in the third direction D3 may differ from the distance between the third semiconductor chip 400 and the second semiconductor chip 300 adjacent to the third semiconductor chip 400 in the third direction D3.

The minimum width of the first adhesive layer ADc1 in the third direction D3 may differ from the minimum width of the second adhesive layer ADc2 in the third direction D3. For example, the minimum vertical width of the first adhesive layer ADc1 may differ from the minimum vertical width of the second adhesive layer ADc2.

Although the first adhesive layer ADc1 is shown and described as being interposed between the first semiconductor chip 200 and the second semiconductor chip 300 adjacent to the first semiconductor chip 200, and the second adhesive layers ADc2 are being shown and described as being interposed between the adjacent second semiconductor chips 300 and between the third semiconductor chip 400 and the second semiconductor chip 300 adjacent to the third semiconductor chip 400, the example embodiments of the disclosure are not limited thereto. For example, in some embodiments, first adhesive layers ADc1 may be interposed between the first semiconductor chip 200 and the second semiconductor chip 300 adjacent to the first semiconductor chip 200 and between the adjacent second semiconductor chips 300, respectively, and a second adhesive layer ADc2 may be interposed between the third semiconductor chip 400 and the second semiconductor chip 300 adjacent to the third semiconductor chip 400.

Figure 6:
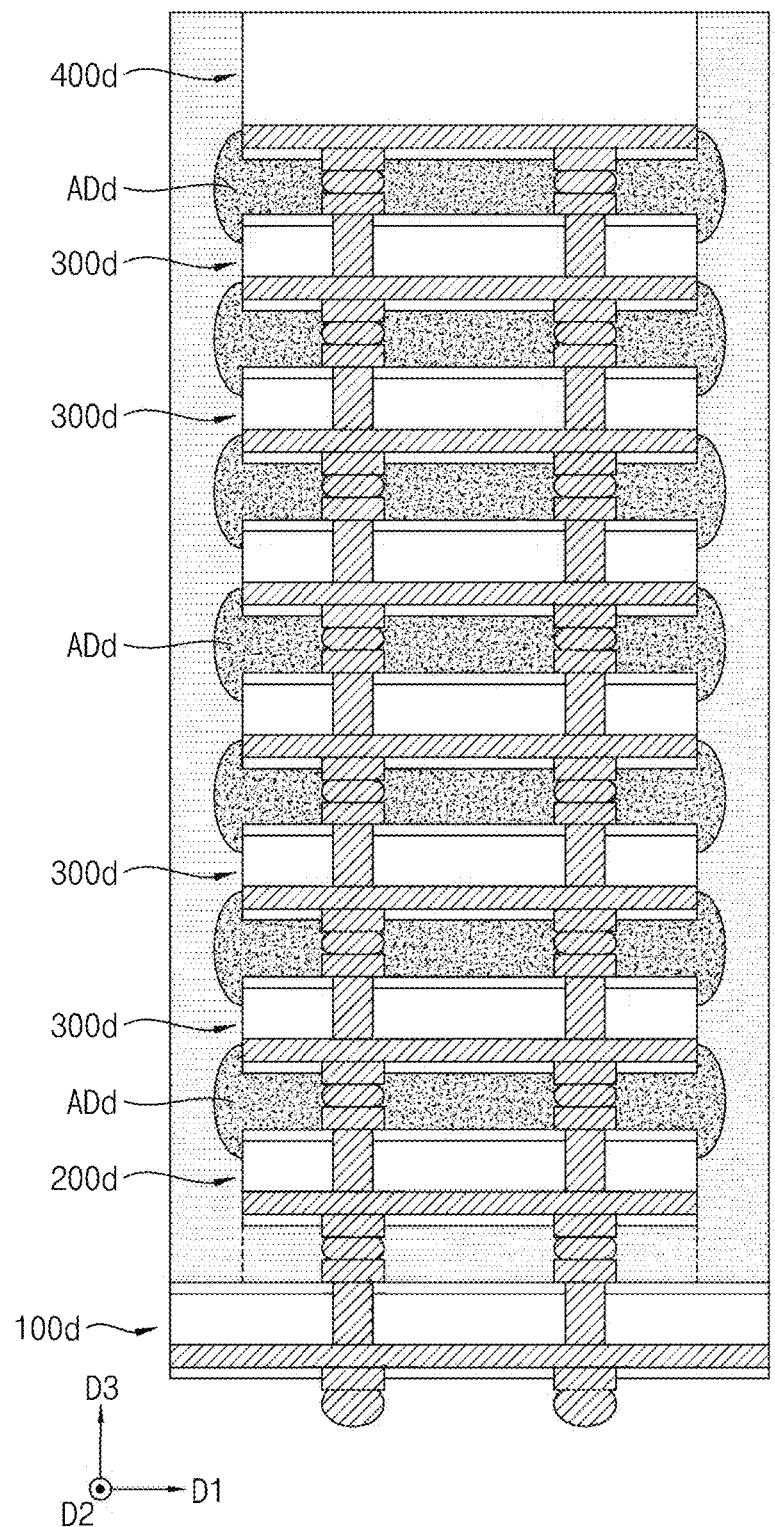
FIG. 6 is a sectional view of a semiconductor package according to some example embodiments of the disclosure.

FIG. 6 is a sectional view of a semiconductor package according to some example embodiments of the disclosure.

Referring to FIG. 6, a semiconductor package 5 may include a base structure 100d, and a first semiconductor chip 200d, second semiconductor chips 300d and a third semiconductor chip 400d that are sequentially stacked over the base structure 100d. Adhesive layers Add may be interposed between the first semiconductor chip 200d and the second semiconductor chip 300d adjacent to the first semiconductor chip 200d, between adjacent ones of the second semiconductor chips 300d and between the third semiconductor chip 400d and the second semiconductor chip 300d adjacent to the third semiconductor chip 400d, respectively. Although the number of the first to third semiconductor chips 200d, 300d, and 400d is shown and described as being eight, the example embodiments of the disclosure are not limited thereto.

Figure 7:
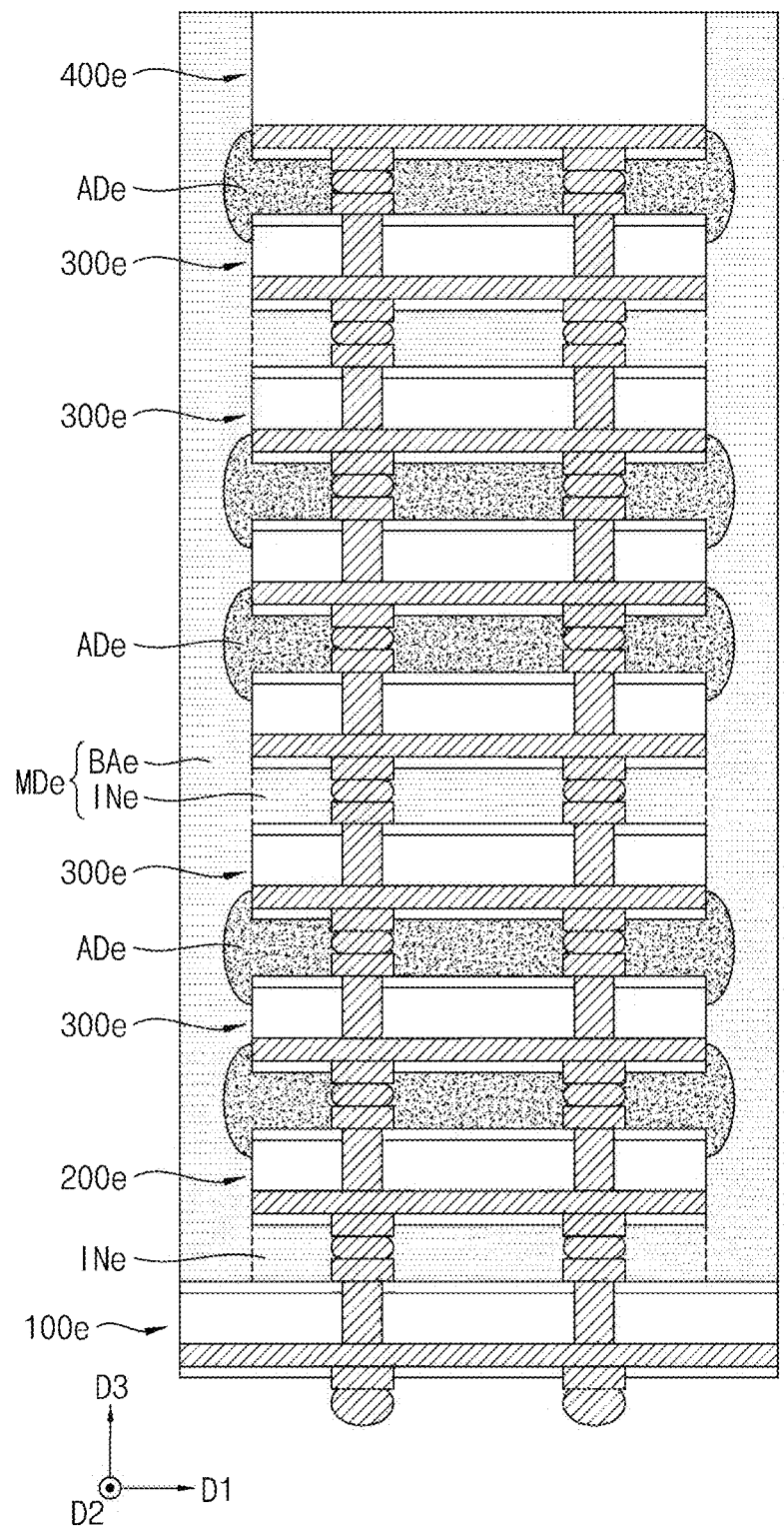
FIG. 7 is a sectional view of a semiconductor package according to some example embodiments of the disclosure.

FIG. 7 is a sectional view of a semiconductor package according to some example embodiments of the disclosure.

Referring to FIG. 7, a semiconductor package 6 may include a base structure 100e, and a first semiconductor chip 200e, second semiconductor chips 300e and a third semiconductor chip 400e which are sequentially stacked over the base structure 100e.

A molding layer MDe may include a base portion Bae, and a plurality of interposition portions INe connected to the base portion Bae. Adhesive layers Ade and the interposition portions INe may be randomly interposed in spaces among the base structure 100e and the first to third semiconductor chips 200e, 300e, and 400e. For example, as shown in FIG. 7, five adhesive layers Ade and three interposition portions INe may be interposed in the spaces among the base structure 100e and the first to third semiconductor chips 200e, 300e and 400e, respectively. However, the positions and the numbers of the adhesive layers ADe and the interposition portions INe interposed in the spaces among the base structure 100e and the first to third semiconductor chips 200e, 300e and 400e.

Figure 8:
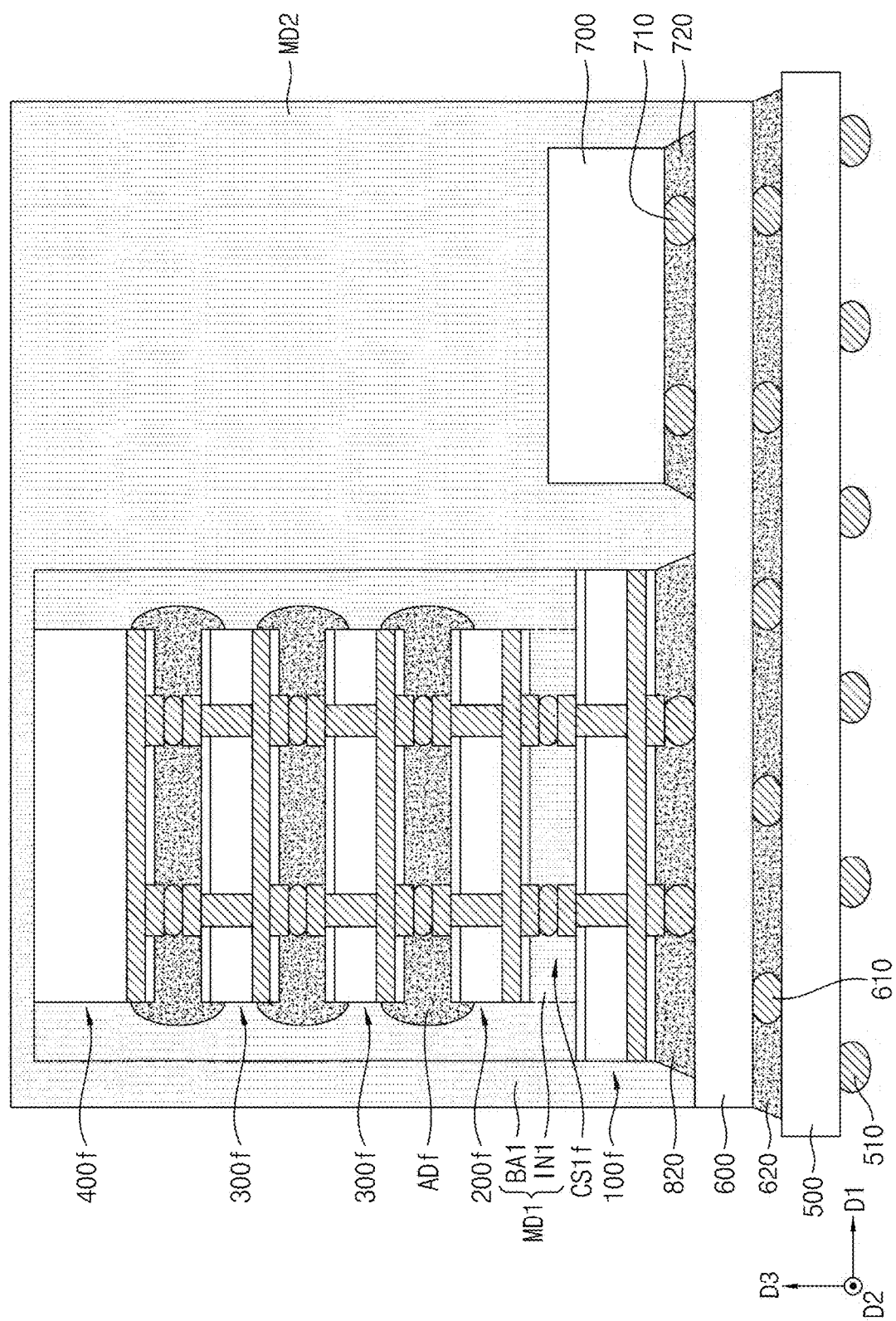
FIG. 8 is a sectional view of a semiconductor package according to some example embodiments of the disclosure.

FIG. 8 is a sectional view of a semiconductor package according to some example embodiments of the disclosure.

Referring to FIG. 8, a semiconductor package 7 may include a package substrate 500. For example, the package substrate 500 may be a printed circuit board (PCB). External terminals 510 electrically connected to the package substrate 500 may be provided. The external terminals 510 may be provided under the package substrate 500. The external terminals 510 may include a conductive material. The semiconductor package 7 may be mounted on an external device (for example, a main board) through the external terminals 510.

An interposer 600 may be provided over the package substrate 500. First connecting terminals 610 electrically interconnecting the package substrate 500 and the interposer 600 may be provided. The first connecting terminals 610 may include a conductive material. A first underfill layer 620 may be provided between the package substrate 500 and the interposer 600.

A processor chip 700 may be provided over the interposer 600. The processor chip 700 may include logic circuits. For example, the processor chip 700 more specifically may include, but is not limited to, a graphics processing unit (GPU) central processing unit (CPU), an arithmetic logic unit (ALU), a digital signal processor, a microcomputer, a field programmable gate array (FPGA), and programmable logic unit, a microprocessor, application-specific integrated circuit (ASIC), etc. Second connecting terminals 710 electrically interconnecting the processor chip 700 and the interposer 600 may be provided. The second connecting terminals 710 may be provided between the processor chip 700 and the interposer 600. The second connecting terminals 710 may include a conductive material. A second underfill layer 720 may be provided between the processor chip 700 and the interposer 600.

A base structure 100f and first to third semiconductor chips 200f, 300f, and 400f may be sequentially provided over the interposer 600 in a third direction D3. The base structure 100f and the first to third semiconductor chips 200f, 300f, and 400f may be spaced apart from the processor chip 700 in a first direction D1. A third underfill layer 820 may be provided between the base structure 100f and the interposer 600.

Adhesive layers ADf may be provided between the first semiconductor chip 200f and the second semiconductor chip 300f adjacent to the first semiconductor chip 200f, between adjacent ones of the second semiconductor chips 300f and between the third semiconductor chip 400f and the second semiconductor chip 300f adjacent to the third semiconductor chip 400f, respectively.

A first molding layer MD1 covering the first semiconductor chip 200f, the second semiconductor chips 300f and the adhesive layers ADf may be provided. The first molding layer MD1 may include a base portion BA1 and an interposition portion IN1. The interposition portion IN1 of the first molding layer MD1 may be interposed between the base structure 100f and the first semiconductor chip 200f. The first molding layer MD1 may contact a first connecting structure CS1f between the base structure 100f and the first semiconductor chip 200f. The interposition portion IN1 of the first molding layer MD1 may contact the first connecting structure CS1f between the base structure 100f and the first semiconductor chip 200f. The first molding layer MD1 may include a material different from those of the first to third underfill layers 620, 720, and 820.

A second molding layer MD2 covering the first to third semiconductor chips 200f, 300f and 400f and the processor chip 700 may be provided. The second molding layer MD2 may cover a top surface of the interposer 600. The second molding layer MD2 may contact the second underfill layer 720 and the third underfill layer 820. A boundary dividing the second molding layer MD2 and the second underfill layer 720 from each other may be formed between the second molding layer MD2 and the second underfill layer 720. A boundary dividing the second molding layer MD2 and the third underfill layer 820 from each other may be formed between the second molding layer MD2 and the third underfill layer 820. The second molding layer MD2 may include a material different from those of the first to third underfill layers 620, 720 and 820.

Figure 9:
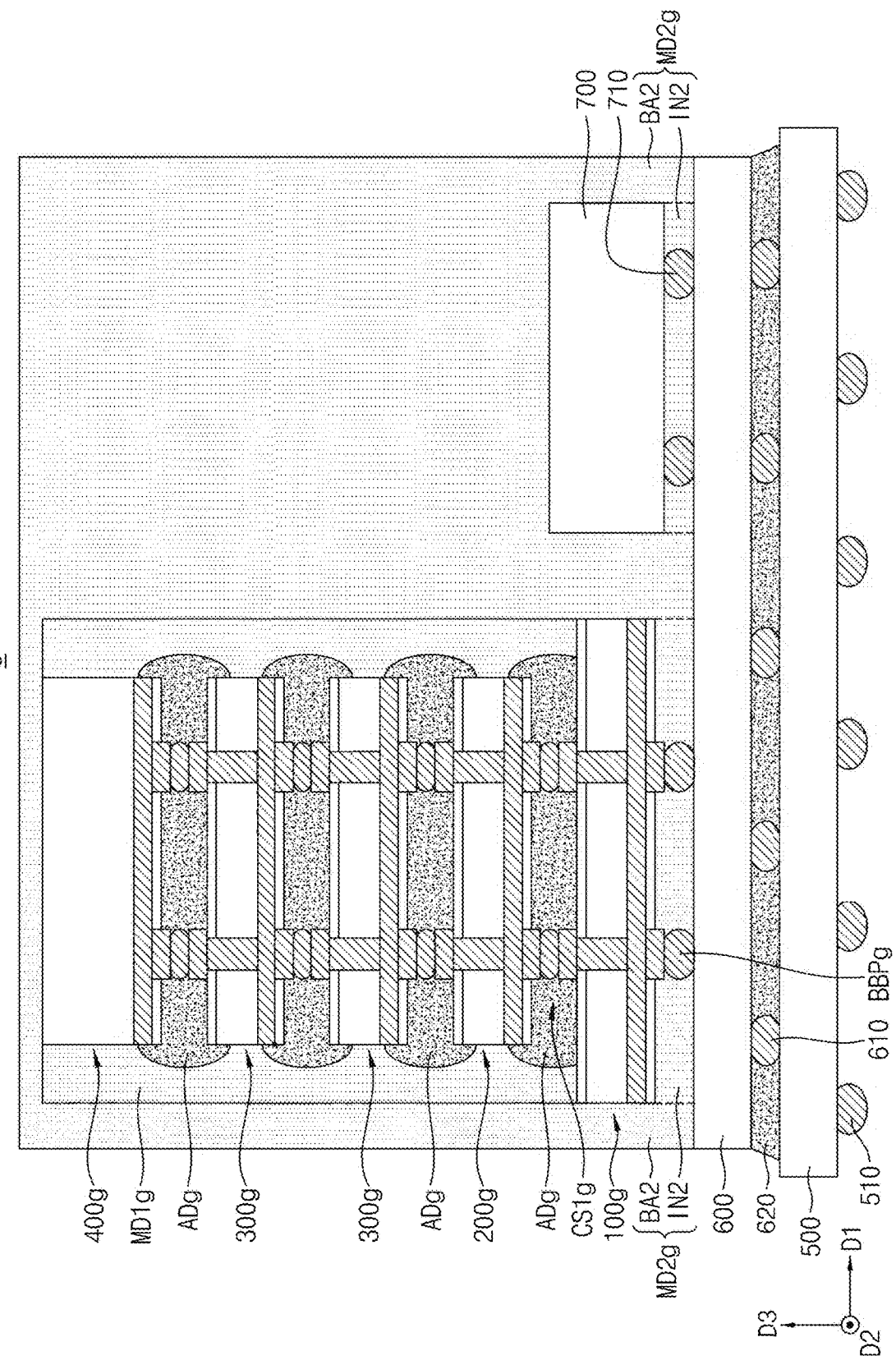
FIG. 9 is a sectional view of a semiconductor package according to some example embodiments of the disclosure.

FIG. 9 is a sectional view of a semiconductor package according to some example embodiments of the disclosure.

Referring to FIG. 9, a semiconductor package 8 may include a package substrate 500, external terminals 510, an interposer 600, first connecting terminals 610, a first underfill layer 620, a processor chip 700, and second connecting terminals 710.

A base structure 100g and first to third semiconductor chips 200g, 300g, and 400g may be sequentially provided over the interposer 600 in a third direction D3. Adhesive layers ADg may be provided between the base structure 100g and the first semiconductor chip 200g, between the first semiconductor chip 200g and the second semiconductor chip 300g adjacent to the first semiconductor chips 200g, between adjacent ones of the second semiconductor chips 300g and between the third semiconductor chip 400g and the second semiconductor chip 300g adjacent to the third semiconductor chip 400g, respectively.

A first molding layer MD1g covering the first semiconductor chip 200g, the second semiconductor chips 300g and the adhesive layers ADg may be provided. The first molding layer MD1g may be spaced apart from a first connecting structure CS1g between the base structure 100g and the first semiconductor chip 200g. A portion of the adhesive layer ADg corresponding to the first connecting structure CS1g may be interposed between the first molding layer MD1g and the first connecting structures CS1g.

A second molding layer MD2g covering the base structure 100g, the first to third semiconductor chips 200g, 300g and 400g and the processor chip 700 may be provided. The second molding layer MD2g may include a base portion BA2, and interposition portions IN2 connected to the base portion BA2. Each interposition portion BA2 may be interposed between the base structure 100g and the interposer 600 or between the processor chip 700 and the interposer 600. Each interposition portion IN2 may surround the second connecting terminals 710 or base bumps BBPg.

In the semiconductor package according to some example embodiments of the disclosure, a triple point where the molding layer, the adhesive layer, and the protective layer contact may not be formed because the interposition portion of the molding layer is provided. Accordingly, reliability of the semiconductor package may be enhanced.

While the some example embodiments of the disclosure have been described with reference to the accompanying drawings, it should be understood by those skilled in the art that various modifications may be made without departing from the scope of the disclosure and without changing essential features thereof. Therefore, the above-described embodiments should be considered in a descriptive sense only and not for purposes of limitation.

What is claimed is:

1. A method of manufacturing a semiconductor package, comprising:

forming a base structure;

stacking a first semiconductor chip over the base structure, a cavity being defined between the base structure and the first semiconductor chip;

stacking a second semiconductor chip over the first semiconductor chip, using an adhesive layer; and forming a molding layer covering the first semiconductor chip, the second semiconductor chip and the adhesive layer, wherein the forming the molding layer includes filling the cavity with an interposition portion of the molding layer.

2. The method of manufacturing the semiconductor package according to claim 1, wherein the stacking the first semiconductor chip over the base structure comprises forming a connecting structure electrically interconnecting the base structure and the first semiconductor chip, and wherein the connecting structure is exposed by the cavity.

3. The method of manufacturing the semiconductor package according to claim 1, wherein the stacking the second semiconductor chip over the first semiconductor chip comprises providing the adhesive layer between the first semiconductor chip and the second semiconductor chip.

4. The method of manufacturing the semiconductor package according to claim 1, wherein a bottom surface of the first semiconductor chip includes at least one pad and a portion including a remainder of the bottom surface, and wherein the cavity exposes the portion of the bottom surface of the first semiconductor chip.

5. The method of manufacturing the semiconductor package according to claim 1, wherein the first semiconductor chip includes a lower protective layer, and wherein the cavity exposes an overall portion of a bottom surface of the lower protective layer.

6. The method of manufacturing the semiconductor package according to claim 1, wherein the cavity is provided between a bottom surface of the first semiconductor chip and a top surface of the base structure.

7. The method of manufacturing the semiconductor package according to claim 1, wherein the stacking the first semiconductor chip over the base structure comprises, covering a first preliminary semiconductor chip with a first tape, dividing the first preliminary semiconductor chip into a plurality of first semiconductor chips, and separating the first semiconductor chip from the first tape.

8. The method of manufacturing the semiconductor package according to claim 1, wherein the stacking the second semiconductor chip over the first semiconductor chip comprises, providing a second preliminary semiconductor chip, providing a preliminary adhesive layer and a second tape, the preliminary adhesive layer covering a-the second preliminary semiconductor chip and a the second tape supporting the preliminary adhesive layer, dividing the second preliminary semiconductor chip into a plurality of second semiconductor chips and the preliminary adhesive layer into a plurality of adhesive layers, and separating the second semiconductor chip and the preliminary adhesive layer from the second tape.

9. The method of manufacturing the semiconductor package according to claim 1, wherein the cavity vertically overlaps with the base structure, the first semiconductor chip and the second semiconductor chip.

10. A method of manufacturing a semiconductor package, comprising:

forming a base structure, comprising a lower pad;

forming a first semiconductor chip, comprising a connecting bump and an upper pad;

forming a first connecting structure, by interconnecting the lower pad, the connecting bump and the upper pad, stacked sequentially;

stacking a second semiconductor chip over the first semiconductor chip, using an adhesive layer; and forming a molding layer covering the first semiconductor chip, the first connecting structure, the second semiconductor chip and the adhesive layer, wherein the molding layer includes an interposition portion, which contacts the first connecting structure.

11. The method of manufacturing the semiconductor package according to claim 10, wherein the interposition portion contacts a top surface of the base structure and a bottom surface of the first semiconductor chip.

12. The method of manufacturing the semiconductor package according to claim 10, wherein the base structure is isolated from direct contact with the first semiconductor chip; and a vertical distance between the base structure and the first semiconductor chip is 5 to 20 μm.

13. The method of manufacturing the semiconductor package according to claim 10, wherein the interposition portion entirely covers a bottom surface of the first semiconductor chip.

* * * * *